US009977329B2

(12) United States Patent
Iimori et al.

(10) Patent No.: US 9,977,329 B2
(45) Date of Patent: May 22, 2018

(54) NEGATIVE PHOTOSENSITIVE RESIN COMPOSITION, CURED FILM OBTAINED BY CURING SAME, METHOD FOR PRODUCING CURED FILM, OPTICAL DEVICE PROVIDED WITH CURED FILM, AND BACKSIDE-ILLUMINATED CMOS IMAGE SENSOR

(71) Applicant: TORAY INDUSTRIES, INC., Tokyo (JP)

(72) Inventors: Hirokazu Iimori, Otsu (JP); Toshiyasu Hibino, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days. days.

(21) Appl. No.: 15/113,119

(22) PCT Filed: Jan. 21, 2015

(86) PCT No.: PCT/JP2015/051490
§ 371 (c)(1),
(2) Date: Jul. 21, 2016

(87) PCT Pub. No.: WO2015/111607
PCT Pub. Date: Jul. 30, 2015

(65) Prior Publication Data
US 2017/0010532 A1 Jan. 12, 2017

(30) Foreign Application Priority Data
Jan. 24, 2014 (JP) ................. 2014-010948

(51) Int. Cl.
| *G03F 7/028* | (2006.01) |
| *G03F 7/075* | (2006.01) |
| *G02B 5/20* | (2006.01) |
| *G03F 7/027* | (2006.01) |
| *G03F 7/004* | (2006.01) |
| *G03F 7/031* | (2006.01) |
| *G03F 7/16* | (2006.01) |
| *G03F 7/20* | (2006.01) |
| *G03F 7/26* | (2006.01) |
| *H01L 27/146* | (2006.01) |

(52) U.S. Cl.
CPC ............. *G03F 7/0757* (2013.01); *G02B 5/20* (2013.01); *G03F 7/0047* (2013.01); *G03F 7/027* (2013.01); *G03F 7/028* (2013.01); *G03F 7/031* (2013.01); *G03F 7/16* (2013.01); *G03F 7/168* (2013.01); *G03F 7/20* (2013.01); *G03F 7/26* (2013.01); *H01L 27/1464* (2013.01); *H01L 27/14609* (2013.01); *H01L 27/14621* (2013.01); *H01L 27/14643* (2013.01); *H01L 27/14685* (2013.01)

(58) Field of Classification Search
CPC ...... G03F 7/0007; G03F 7/0757; G03F 7/027; G03F 7/028; G03F 7/031; H01L 27/14621; H01L 27/1464; H01L 27/14685; G02B 5/20; G02B 5/201
USPC ....................... 430/7, 281.1, 287.1
See application file for complete search history.

(56) References Cited

U.S. PATENT DOCUMENTS

2014/0178822 A1* 6/2014 Wu .................. G03F 7/038
430/285.1

FOREIGN PATENT DOCUMENTS

| CN | 103348289 A | 10/2013 |
| JP | 2001081404 | 3/2001 |
| JP | 2003075997 | 3/2003 |
| JP | 2005-089659 A * | 4/2005 |
| JP | 2005266075 | 9/2005 |
| JP | 2006293337 | 10/2006 |
| JP | 2006312717 | 11/2006 |
| JP | 2007724877 | 9/2007 |
| JP | 2008024832 | 2/2008 |
| JP | 2008105999 | 5/2008 |
| JP | 2009179678 | 8/2009 |
| JP | 2010160300 | 7/2010 |
| JP | 2010204298 | 9/2010 |
| JP | 2011128469 | 6/2011 |
| JP | 2011165396 | 8/2011 |
| JP | 2012082393 | 4/2012 |
| JP | 2012215837 | 11/2012 |
| JP | 2014084360 | 5/2014 |
| JP | 2014160271 | 9/2014 |
| JP | 2014194508 | 10/2014 |
| JP | 2014197171 A | 10/2014 |
| SG | 184526 A1 | 11/2012 |
| WO | 2011040248 | 4/2011 |
| WO | 2011129210 | 10/2011 |
| WO | 2012008387 | 1/2012 |
| WO | 2013108716 A1 | 7/2013 |

OTHER PUBLICATIONS

Computer-generated translation of JP 2005-089659 (Apr. 2005).*
International Search Report and Written Opinion for International Application No. PCT/JP2015/051490, dated Mar. 3, 2015, 14 pages.
Singapore Written Opinion and Search Report for SG Application No. 11201606071W, dated Sep. 20, 2017, 9 pages.

* cited by examiner

*Primary Examiner* — John A McPherson
(74) *Attorney, Agent, or Firm* — RatnerPrestia

(57) ABSTRACT

The present invention provides a negative photosensitive resin composition including the following (a) to (d): (a) metallic compound particles, (b) a polysiloxane compound, (c) a compound having at least 1 group containing an α,β-unsaturated carboxylate ester structure, and (d) a photopolymerization initiator, the composition also including (e) a compound containing maleimide group.

16 Claims, No Drawings

NEGATIVE PHOTOSENSITIVE RESIN COMPOSITION, CURED FILM OBTAINED BY CURING SAME, METHOD FOR PRODUCING CURED FILM, OPTICAL DEVICE PROVIDED WITH CURED FILM, AND BACKSIDE-ILLUMINATED CMOS IMAGE SENSOR

CROSS REFERENCE TO RELATED APPLICATIONS

This is the U. S. National Phase application of PCT International Application No. PCT/JP2015/051490, filed Jan. 21, 2015, and claims priority to Japanese Patent Application No. 2014-010948, filed Jan. 24, 2014, the disclosures of each of these applications being incorporated herein by reference in their entireties for all purposes.

FIELD OF THE INVENTION

This invention relates to a negative photosensitive resin composition which is soluble in an alkaline aqueous solution after being exposed to UV to visible light, and which is suitable for the material of pixels which is required to have high transparency and high refractive index that is formed between condenser micro-lens and the photo-sensor section in a solid-state image sensing device or the like.

BACKGROUND OF THE INVENTION

With recent rapid development of digital cameras and mobile phones equipped with cameras, further downsizing and increase in the pixel count of the solid-state image sensing device have been required. In solid-state image sensor, a color resist material is provided between optical sensor section and condenser lens to selectively guide the light having the desired wavelength to the optical sensor section. The downsizing and increase in the pixel count of the solid-state image sensor are associated with the problem of decrease in light collecting (condensing) efficiency and sensitivity. Accordingly, transparent pixels and partitions having a high refractive index are formed in the same layer as the color resist material for efficient light collection to thereby avoid decrease in the device sensitivity. Typical methods used for preparing such pixel or partition include processing of an inorganic film deposited by CVD or the like by dry etching and processing of the film formed by coating a resin. Formation of a material with the refractive index of 1.65 to 2.00 optimal for the lens or the optical waveguide is difficult by the former method, and therefore, the latter method has become the focus of attention.

So far, there have been proposed, for example, a photosensitive siloxane composition containing a polysiloxane compound, a quinone diazide compound, a solvent, and a thermally crosslinkable compound (see, for example, Patent Document 1), a negative photosensitive resin composition containing a polymer having carboxyl group and/or phenolic hydroxy group and ethylenically unsaturated double bond group, a photo-radical polymerization initiator, and a compound having at least 3 groups each containing an unsaturated carboxylate ester structure having hydroxy group in one molecule (see, for example, Patent Document 2), a material having a high refractive index containing a siloxane compound having an aromatic hydrocarbon group (see, for example, Patent Document 3). However, it has been difficult to form a cured film having the high refractive index required for the material used for the lens used in CMOS image sensor from these materials. In view of such situation, particles of metallic compounds such as titanium oxide and zirconium oxide are generally added in the transparent lens materials for the CMOS image sensor for the purpose of improving the refractive index. For example, there have been disclosed a positive photosensitive resin composition containing polyamic acid, a compound having phenolic hydroxy group, a quinone diazide compound, and inorganic particles (see, for example, Patent Document 4) and a silicone copolymer containing silsesquioxane having a phenol unit and a fused polycyclic hydrocarbon group (see, for example, Patent Document 5). These materials, however, suffered from loss of transparency due to the coloring in the curing by polyamic acid or phenolic hydroxy group.

Known materials having a high refractive index and transparency that have been disclosed include a coating composition containing an organosilane, a siloxane oligomer, and metal oxide fine particles and/or sol (see, for example, Patent Document 6) and a siloxane resin composition prepared by copolymerizing a metal oxide particle with an alkoxysilane (see, for example, Patent Document 7). Most of such materials are non-photosensitive, and therefore, they are subjected to patterning by wet etching using a chemical solution or by dry etching using plasma.

Also disclosed are siloxane resin compositions with positive photosensitivity having high refractive index and transparency (see, for example, Patent Document 8). However, solvent resistance of the cured film is not fully realized by the low temperature curing at 200 to 220° C., and curing at a higher cure temperature has been necessary. In the meanwhile, siloxane resin compositions with negative photosensitivity having high refractive index and transparency have also been proposed, and examples include a compound containing silica-coated titanium oxide particles and at least 2 acryloyl groups, photopolymerization initiator composition (see, for example, Patent Document 9), reaction product of an inorganic oxide fine particles and an alkoxysilane compound, inorganic oxide fine particles, and a photopolymerization initiator composition (see, for example, Patent Document 10). These compounds, however, had the problem that they were incapable of forming check pattern and rectangular pattern having the desired high taper angle when they were used for the formation of pixels or partitions, and there has been a demand for materials exhibiting both of these properties.

PATENT DOCUMENT

Patent Document 1: Japanese Unexamined Patent Publication (Kokai) No. 2006-293337
Patent Document 2: Japanese Unexamined Patent Publication (Kokai) No. 2010-160300
Patent Document 3: Japanese Unexamined Patent Publication (Kokai) No. 2008-24832
Patent Document 4: Japanese Unexamined Patent Publication (Kokai) No. 2003-75997
Patent Document 5: Japanese Unexamined Patent Publication (Kokai) No. 2006-312717
Patent Document 6: Japanese Unexamined Patent Publication (Kokai) No. 2001-81404
Patent Document 7: Japanese Unexamined Patent Publication (Kokai) No. 2007-246877
Patent Document 8: International Publication WO 2011/040248
Patent Document 9: Japanese Unexamined Patent Publication (Kokai) No. 2009-179678

Patent Document 10: Japanese Unexamined Patent Publication (Kokai) No. 2014-84360

SUMMARY OF THE INVENTION

Of the conventional materials simultaneously exhibiting high refractive index and high transparency, non-photosensitive materials require patterning by etching method, and accordingly, complicated production process was necessary and the production also suffered from the problem of wiring deterioration by chemical solution or plasma in the etching. In the case of photosensitive materials, sensitivity in the exposure and resolution could not be maintained at a high level in the long time storage at room temperature, and the productivity was also insufficient. In the case of positive photosensitive materials, there has been the problem of transparency, and addition of a post-exposure process after the development has been necessary for improving the transparency.

An aspect of the present invention includes a negative photosensitive resin composition that exhibits high refractive index, high transparency properties with no additional post-exposure process, high sensitivity in the exposure, and high resolution and solvent resistance after the pattern formation, and which is capable of providing a pattern having a rectangular cross section adapted for pixel formation and partition formation.

In order to solve the problems as described above, the present invention includes a negative photosensitive resin composition comprising the following (a) to (d):
(a) metallic compound particles,
(b) a polysiloxane compound,
(c) a compound having at least 1 group containing an α,β-unsaturated carboxylate ester structure, and
(d) a photopolymerization initiator, the composition further comprising
(e) a compound containing maleimide group.

The present invention provides a photosensitive composition which is a negative photosensitive resin composition that exhibits a high index of refraction, high transparency properties with no additional post-exposure process, high sensitivity in the exposure even if stored for prolonged period at room temperature, and high resolution and solvent resistance after the pattern formation, and that provides a pattern having a rectangular cross section adapted for the pixel formation and partition formation. In addition, the present invention does not require the patterning by etching method, and production by a simple procedure is thereby enabled, and deterioration of the wiring by chemical solution or plasma in the etching is also avoided.

DETAILED DESCRIPTION OF EMBODIMENTS OF THE INVENTION

The negative photosensitive resin composition of an embodiment of the present invention is a negative photosensitive composition comprising the following (a) to (d):
(a) metallic compound particles,
(b) a polysiloxane compound,
(c) a compound having at least 1 group containing an α,β-unsaturated carboxylate ester structure, and
(d) a photopolymerization initiator, the composition further comprising
(e) a compound containing maleimide group.

The metallic compound particles (a) used in the negative photosensitive resin composition of the present invention are not particularly limited. The preferred are at least one member selected from aluminum compound particles, tin compound particles, titanium compound particles, and zirconium compound particles; or a composite particles of at least one metallic compound selected from aluminum compound, tin compound, titanium compound, and zirconium compound with a silicon compound in view of improving the refractive index, and hence, light collection.

The metallic compound particles (a) preferably have a number average particle diameter of 1 nm to 400 nm. When the number average particle diameter of the metallic compound particles (a) is at least 1 nm, crack generation in the thick film formation can be suppressed, and the number average particle diameter is more preferably at least 5 nm in such point of view.

When the number average particle diameter of the metallic compound particles (a) is up to 400 nm, the cured film will have an improved transparency for visible light, and the number average particle diameter is more preferably up to 70 nm in such point of view. The number average particle diameter of the metallic compound particles (a) can be measured by gas adsorption method, dynamic light scattering method, X-ray small angle scattering method, direct measurement of the particle diameter by a transmission electron microscope or scanning electron microscope, or the like, and in the present invention, the number average particle diameter is the one measured by the dynamic light scattering method. The apparatus used for the measurement is not particularly limited, and exemplary apparatus include Dynamic Light Scattering Spectrophotometer DLS-8000 (manufactured by Otsuka Electronics Co., Ltd.).

Examples of the metallic compound particles (a) include tin oxide-titanium oxide composite, particles "OptLake TR-502" and "OptLake TR-504", silicon oxide-titanium oxide composite particles "OptLake TR-503", "OptLake TR-513", "OptLake TR-520", "OptLake TR-527", "OptLake TR-528", "OptLake TR-529", "OptLake TR-543", "OptLake TR-544", and "OptLake TR-550", and titanium oxide particles "OptLake TR-505" ("OptLake" (registered trademark) manufactured by Catalysts and Chemicals Industries Co., Ltd.), NOD-7771GTB (product name, manufactured by Nagase ChemteX Corporation), zirconium oxide particles (manufactured by Kojundo Chemical Laboratory Co., Ltd.), tin oxide-zirconium oxide composite particles (manufactured by Catalysts and Chemicals Industries Co., Ltd.), tin oxide particles (manufactured by Kojundo Chemical Laboratory Co., Ltd.), "BIRAL" (registered trademark) Zr-C20 (titanium oxide particles having average particle diameter of 20 nm manufactured by Taki Chemical Co., Ltd.), ZSL-10A (titanium oxide particles having average particle diameter of 60 to 100 nm manufactured by Daiichi Kigenso Kagaku Kogyo Co., Ltd.), "NanoUse" (registered trademark) OZ-30M (titanium oxide particles having average particle diameter of 7 nm manufactured by Nissan Chemical Industries, Limited), SZR-M and SZR-K (zirconium oxide particles manufactured by Sakai Chemical Industry Co., Ltd.), HXU-120JC (zirconium oxide particles manufactured by Sumitomo Osaka Cement Co., Ltd.), ZR-010 (zirconium oxide particles manufactured by Solar Co., Ltd.), and ZRPMA (zirconia particles manufactured by C. I. Kasei Co., Ltd.).

Next, the polysiloxane compound (b) used in the negative photosensitive composition of an embodiment of the present invention is described.

The polysiloxane compound (b) used in the present invention is not particularly limited as long as it is a polymer having a siloxane main skeleton, namely, a polymer having Si—O bond. However, the preferred is a polysiloxane compound having the structural unit represented by the general formula (1) and/or (2) in the main skeleton in view of improving the solubility in alkali to improve solubility in the developer solution of the non-pattern area to thereby facilitate the patterning (the step of forming the pattern by dissolution of the non-pattern area to the developer solution is hereinafter also referred to as the patterning), and maintain sensitivity in the exposure at a higher level.

[Chemical formula 1]

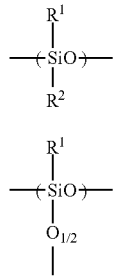

[wherein $R^1$ is an organic group containing carboxyl group and/or a dicarboxylic anhydride structure, $R^2$ is hydrogen, an alkyl group containing 1 to 6 carbon atoms, an acyl group containing 2 to 6 carbon atoms, or an allyl group containing 6 to 16 carbon atoms.]

Exemplary $R^1$ include propyl 3-succinate anhydride group, propyl 3-succinate anhydride group, propionic acid group, propyl 3-maleate group, propyl 3-phthalate group, propyl 3-naphthalate anhydride group, propyl 3-(p-benzoate) group, propyl 3-(m-benzoate) group, and propyl 3-(o-benzoate) group.

$R^2$ represents hydrogen, an alkyl group containing 1 to 6 carbon atoms, an acyl group containing 2 to 6 carbon atoms, or an aryl group containing 6 to 16 carbon atoms, and exemplary alkyl groups include methyl group, ethyl group, n-propyl group, and n-butyl group, and exemplary acyl groups include acetyl group, propionyl group, and acryloyl group. Exemplary aryl groups include phenyl group and naphthyl group.

The $R^1$ in the compound of the general formula (1) and/or (2) is preferably an organic group having a dicarboxylic anhydride represented by any one of the following general formulae (11) to (13).

[Chemical formula 2]

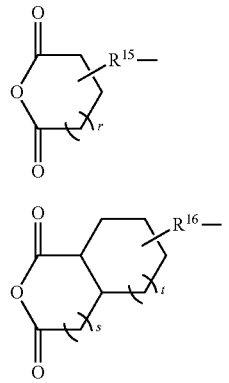

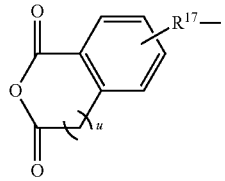

[In the general formulae (11) to (13), $R^{15}$, $R^{16}$, and $R^{17}$ are single bond, a chain aliphatic hydrocarbon group containing 1 to 10 carbon atoms, a cyclic aliphatic hydrocarbon group containing 3 to 16 carbon atoms, an alkyl carbonyloxy group containing 2 to 6 carbon atoms, carbonyl group, ether group, ester group, amide group, an aromatic group containing 6 to 16 carbon atoms, or a divalent group having any of these groups; the hydrogen atom of these groups being optionally substituted with an alkyl group containing 1 to 10 carbon atoms, an alkenyl group containing 2 to 10 carbon atoms, an aryl group containing 6 to 16 carbon atoms, an alkylcarbonyloxy group containing 2 to 6 carbon atoms, hydroxy group, amino group, carboxyl group, or thiol group; and r, s, t, and u represent an integer of 0 to 3.]

The "single bond" means the state where $R^{15}$, $R^{16}$, or $R^{17}$ is not present as the bonding group, and Si atom is directly bonded to the position where $R^{15}$, $R^{16}$, or $R^{17}$ could have bonded.

When the molar ratio of the Si atoms in the structural unit represented by the general formula (1) and/or (2) is at least 5 mol %, reliability in the patterning by alkali developer solution in the development will be improved, while such ratio of up to 30 mol % results in the improved resistance to moisture and heat after the curing into the cured film. Accordingly, ratio of the Si atoms (mole) in the structural unit represented by the general formula (1) and/or (2) constituting the polysiloxane compound in relation to the Si atoms (mole) in the polysiloxane compound is preferably at least 5 mol % and up to 30 mol %.

The polysiloxane compound (b) preferably further comprises a structural unit represented by the general formula (3) and/or (4) in addition to the structural unit represented by the general formula (1) and/or (2). When the polysiloxane compound (b) also contains the structural unit represented by the general formula (3) and/or (4), the polymer will undergo photo-crosslinking resulting in the improved crosslinking density of the cured film, and this results in the improvement in the chemical resistance, and the cross-sectional shape of the pattern will resemble a rectangle.

[Chemical formula 3]

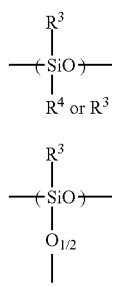

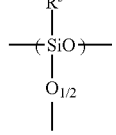

[R³ is an organic group containing an alkenyl group containing 2 to 10 carbon atoms, R⁴ is hydrogen, an alkyl group containing 1 to 6 carbon atoms, an acyl group containing 2 to 6 carbon atoms, an organic group containing an alkenyl group containing 2 to 10 carbon atoms, or an aryl group containing 6 to 16 carbon atoms.]

R⁴ used may be the one selected from the groups described for R² in general formula (1), and R² in general formula (1) and R⁴ in general formula (3) may be either the same or different.

Examples of R³ include vinyl group, allyl group, styryl group, γ-acryloylpropyl group, methacryloyl group, acryloyl group (methacryloyl group and acryloyl group may be together referred to as a "(meth)acryloyl group", and this also applies to the following description), acryloylpropylmethyl, and glycidoxy group, which may be used in combination of two or more. Of these, the preferred are allyl group, vinyl group, (meth)acryloyl group, and styryl group in view of the high reactivity and improved sensitivity, and hence, high crosslinking density.

Other structural units which are applicable to the polysiloxane compound (b) used in the negative photosensitive composition of the present invention are not particularly limited, and examples include the structural unit obtained by polycondensing the silane monomer of the following general formula (14) and/or (15):

[Chemical formula 4]

(14)

In the organosilane represented by the general formula (14), $R^{18}$ represents an alkyl group containing 1 to 10 carbon atoms, an alkenyl group containing 2 to 10 carbon atoms, or an aryl group containing 6 to 15 carbon atoms, the plurality of $R^{18}$ being independently the same or different. The "plurality of $R^{18}$" as used herein represents the case when n is 2 or 3. These alkyl group and aryl group may be optionally substituted depending on the properties of the composition. Examples of the alkyl group and substituted alkyl group include methyl group, ethyl group, n-propyl group, isopropyl group, n-butyl group, t-butyl group, n-hexyl group, n-decyl group, trifluoromethyl group, 3,3,3-trifluoropropyl group, 3-glycidoxypropyl group, 2-(3,4-epoxycyclohexyl)ethyl group, [(3-ethyl-3-oxethanyl)methoxy]propyl group, 3-aminopropyl group, 3-mercaptopropyl group, 3-isocyanate propyl group, 1-(p-hydroxyphenyl)ethyl group, 2-(p-hydroxyphenyl)ethyl group, and 4-hydroxy-5-(p-hydroxyphenylcarbonyloxy)pentyl group, and examples of the aryl group and substituted aryl group include phenyl group, tolyl group, p-hydroxyphenyl group, and naphthyl group.

$R^{19}$ in the general formula (14) represents hydrogen, an alkyl group containing 1 to 6 carbon atoms, an acyl group containing 2 to 6 carbon atoms, or an aryl group containing 6 to 15 carbon atoms, the plurality of $R^{19}$ being independently the same or different. The "plurality of $R^{19}$" as used herein represents the case when "4−n" is 2 to 4. These alkyl group, acyl group, and aryl group may be optionally substituted depending on the properties of the composition. Examples of the alkyl group include methyl group, ethyl group, n-propyl group, isopropyl group, and n-butyl group, and examples of the acyl group include acetyl group. Examples of the aryl group include phenyl group.

The n in the general formula (14) represents an integer of 0 to 3. The monomer is tetrafunctional silane when n is 0, trifunctional silane when n is 1, difunctional silane when n is 2, and monofunctional silane when n is 3.

Examples of the organosilane represented by general formula (14) include tetrafunctional silanes such as tetramethoxy silane, tetraethoxy silane, tetraacetoxysilane, and tetraphenoxysilane; trifunctional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxethanyl)methoxy]propyltrimethoxysilane, [(3-ethyl-3-oxethanyl)methoxy]propyltriethoxysilane, 3-mercaptopropyltrimethoxysilane, 1-naphthyltrimethoxysilane, 1-naphthyltriethoxysilane, 1-naphthyltri-n-propoxysilane, 2-naphthyltrimethoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 2-fluorenonyltrimethoxysilane, 1-pyrenyltrimethoxysilane, 2-indenyltrimethoxysilane, and 5-acenaphthenyltrimethoxysilane; difunctional silane such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, and (3-glycidoxypropyl)methyldiethoxysilane; and monofunctional silane such as trimethylmethoxysilane, tri-n-butylethoxysilane, (3-glycidoxypropyl)dimethylmethoxysilane, and (3-glycidoxypropyl)dimethylethoxysilane; which may be used alone or in combination of two or more. Of these organosilane, the preferred are trifunctional silanes in view of the crack resistance and hardness of the cured film.

[Chemical formula 5]

(15)

In the organosilane represented by the general formula (15), $R^{20}$ to $R^{23}$ in the formula are independently hydrogen, an alkyl group containing 1 to 6 carbon atoms, an acyl group containing 2 to 6 carbon atoms, or an aryl group containing 6 to 15 carbon atoms, the alkyl group, acyl group, and aryl group being optionally substituted depending on the properties of the composition. Examples of the alkyl group include methyl group, ethyl group, n-propyl group, isopropyl group, and n-butyl group, and examples of the acyl group include acetyl group. Examples of the aryl group include phenyl group. The v in the general formula (15) is an integer of 2 to 8, and v may have a distribution.

Use of the organosilane represented by the general formula (15) enables production of a positive photosensitive composition having improved sensitivity and resolution while retaining its high heat resistance and transparency.

Examples of the organosilane represented by the general formula (15) include methyl silicate 51 (manufactured by Fuso Chemical Co., Ltd.), M silicate 51, silicate 40, and silicate 45 (manufactured by Tama Chemicals Co., Ltd.), methyl silicate 51, methyl silicate 53A, ethyl silicate 40, and ethyl silicate 48 (manufactured by Colcoat Co., Ltd.).

When the polysiloxane compound (b) is synthesized in the state mixed with the metallic compound particles (a), the metallic compound particles (a) and the polysiloxane compound (b) will be partially bonded. When the metallic compound particles (a) and the polysiloxane compound (b) are partially bonded in the negative photosensitive resin composition of the present invention, the metallic compound particles (a) will have improved dispersibility, and hence, improved storage stability.

When content of the metallic compound particles (a) is at least 10 parts by weight in relation to 100 parts by weight of the polysiloxane compound (b), the resulting cured film will have higher refractive index, and hence, improved light gathering efficiency, and when the content is up to 500 parts by weight, formation of the air layer in the course of producing the cured film will be suppressed, and hence, decrease of the refractive index will be suppressed. Accordingly, content of the metallic compound particles (a) is preferably at least 10 parts by weight and up to 500 parts by weight in relation to 100 parts by weight of the polysiloxane compound (b).

The negative photosensitive resin composition of an embodiment of the present invention contains a compound (c) having at least 1 group containing α,β-unsaturated carboxylate ester structure.

Exemplary compounds having one group containing α,β-unsaturated carboxylate ester structure include ethoxylated o-phenylphenol acrylate, methoxy polyethylene glycol #400 acrylate, methoxy polyethylene glycol #550 acrylate, phenoxy polyethylene glycol acrylate, 2-acryloyloxyethyl succinate, isostearyl acrylate, 2-methacryloyloxyethyl phthalic acid, methoxy polyethylene glycol #400 methacrylate, methoxy polyethylene glycol #1000 methacrylate, phenoxy ethyleneglycol methacrylate, stearyl methacrylate, 2-methacryloyloxyethyl succinate, isoamyl acrylate, lauryl acrylate, stearyl acrylate, ethoxy-diethylene glycol acrylate, methoxy-triethylene glycol acrylate, 2-ethylhexyl-diglycol acrylate, methoxy-polyethylene glycol acrylate, methoxy-propylene glycol acrylate, phenoxy ethyl acrylate, phenoxy diethylene glycol acrylate, phenoxy-polyethylene glycol acrylate, nonylphenol EO adduct acrylate, tetrahydrofurfuryl acrylate, isobonyl acrylate, 2-hydroxypropyl acrylate, 2-hydroxybutyl acrylate, 2-acryloyloxyethyl-succinic acid, 2-acryloyloxyethyl hexahydrophthalic acid, 2-acryloyloxyethyl-phthalic acid, 2-acryloyloxyethyl-2-hydroxyethyl-phthalic acid, neopentyl glycol-acrylic acid-benzoate ester, and 2-acryloyloxyethyl acid phosphate.

Other examples include phenol ethylene oxide-modified acrylate ("ethylene oxide-modified" may be hereinafter also abbreviated as "EO-modified"), o-phenylphenol EO-modified acrylate, paracumylphenol EO-modified acrylate, nonylphenol propylene oxide-modified acrylate ("propylene oxide-modified" may be hereinafter also abbreviated as "PO-modified"), nonylphenol EO-modified acrylate, and 2-ethylhexyl EO-modified acrylate.

Exemplary compounds containing two alkenyl groups include ethylene glycol dimethyl ether dimethacrylate, diethylene glycol dimethacrylate, triethylene glycol dimethacrylate, polyethylene glycol dimethacrylate, ethoxylayted bisphenol A dimethacrylate, 1,10-decanediol dimethacrylate, 1,6-hexanediol dimethacrylate, 1,9-nonanediol dimethacrylate, neopentyl glycol dimethacrylate, glycerin dimethacrylate, 2-hydroxy-3-acryloyloxypropyl methacrylate, polyethylene glycol diacrylate, propoxylated ethoxylated bisphenol A diacrylate, ethoxylated bisphenol A diacrylate, propoxylated bisphenol A diacrylate, 1,10-decanediol diacrylate, 1,6-hexanediol diacrylate, 1,9-nonanediol diacrylate, dipropylene glycol diacrylate, tripropylene glycol diacrylate, polypropylene glycol diacrylate, EO-modified diacrylate of bisphenol F, EO-modified diacrylate of bisphenol A, and isocyanuric acid EO-modified diacrylate.

The compound (c) having at least 1 group containing an α,β-unsaturated carboxylate ester structure is not particularly limited. The preferred, however, is at least one member selected from the following general formulae (5) to (10) in view of the presence of rigid organic group in the skeleton and higher resolution.

[Chemical formula 6]

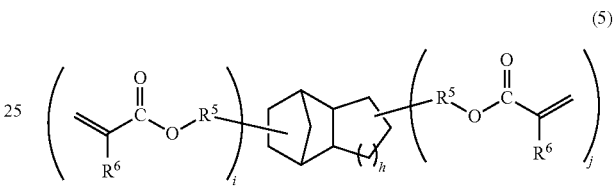

(5)

[in general formula (5), $R^5$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^5$ being independently the same or different; $R^6$ represents hydrogen or methyl group, the plurality of $R^6$ being independently the same or different, h is an integer of 0 to 3, i and j are an integer of 0 to 2, i+j being 1 to 2].

The "single bond" means the state where $R^5$ is not present as the bonding group, and O atom is directly bonded to the position where $R^5$ could have bonded (and this also applies to the following description). The "plurality of $R^5$" and the "plurality of $R^6$" refer to the case wherein i+j=2 in the formula (and this also applies to the following description).

Examples of the compound represented by the general formula (5) include dimethylol tricyclodecane acrylate, dimethylol tricyclodecane diacrylate, and tricyclodecane dimethanol dimethacrylate.

[Chemical Formula 7]

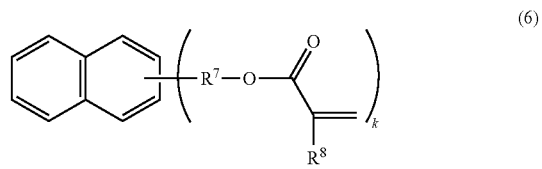

(6)

[in general formula (6), $R^7$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^7$ being independently the same or different, and $R^8$ represents hydrogen or methyl group, the plurality of $R^8$ being independently the same or different, and k is an integer of 1 to 2.]

Examples of the compound represented by the general formula (6) include 1-naphthyl acrylate, 1-naphthyl methacrylate, 2-naphthyl acrylate, 2-naphthyl methacrylate, 1,4-naphthyl diacrylate, 9,9-bis[4-(2-acryloyloxyethoxy)phenyl]fluorene, 1,4-ethylene oxide dimethacrylate naphthalene.

[Chemical formula 8]

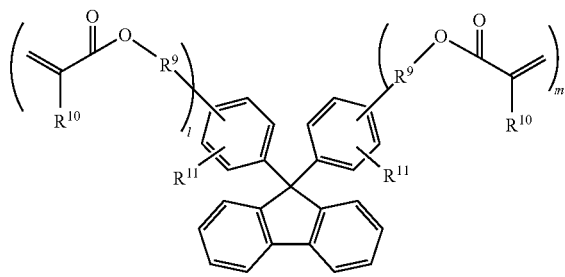

(7)

[in general formula (7), $R^9$ represents single bond, a chain aliphatic group containing 1 to 10 carbon atoms and 1 to 3 oxygen atoms, or a cyclic aliphatic hydrocarbon group containing 3 to 16 carbon atoms, the plurality of $R^9$ being independently the same or different, $R^{10}$ represents hydrogen or methyl group, the plurality of $R^{10}$ being independently the same or different, $R^{11}$ represents hydrogen, a chain aliphatic group containing 1 to 10 carbon atoms and 1 to 3 oxygen atoms, or a cyclic aliphatic hydrocarbon group containing 3 to 16 carbon atoms, the plurality of $R^{11}$ being independently the same or different, and l and m being integers of 0 to 2, l+m being 1 to 2.]

Examples of the compound represented by the general formula (7) include 9,9-bis[4-(2-acryloyloxyethoxy)phenyl]fluorene, 9,9-bis[4-(2-methacryloyloxyethoxy)phenyl]fluorene, 9,9-bis[4-(2-methacryloyloxyethoxy)-3-methylphenyl]fluorene, 9,9-bis[4-(2-acryloyloxyethoxy)-3,5-dimethylphenyl]fluorene, and 9,9-bis[4-(2-methacryloyloxyethoxy)-3,5-dimethyl-phenyl]fluorine. In general formula (7), while one $R^{11}$ is bonded to each of the 2 phenylene groups, a plurality of $R^{11}$ may be bonded to one phenylene group.

[Chemical formula 9]

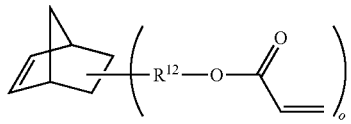

(8)

[In general formula (8), $R^{12}$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^{12}$ being independently the same or different, and o is an integer of 1 to 2.]

Examples of the compound represented by the general formula (8) include norbornene monoacrylate, norbornene diacrylate, norbornene ethylene oxide acrylate, and norbornene oxide diacrylate.

[Chemical formula 10]

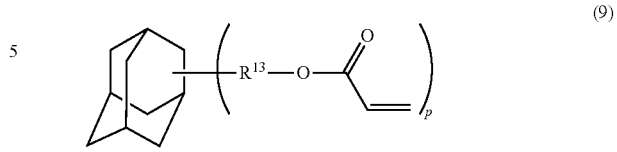

(9)

[In general formula (9), $R^{13}$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^{13}$ being independently the same or different, and p is an integer of 1 to 2.]

Examples of the compound represented by the general formula (9) include adamantane monoacrylate, adamantane diacrylate, adamantane ethylene oxide acrylate, and adamantane ethylene oxide diacrylate.

[Chemical formula 11]

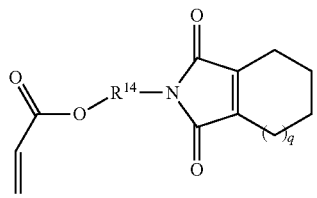

(10)

[In general formula (10), q is an integer of 0 to 3, $R^{14}$ is a chain aliphatic group containing 1 to 10 carbon atoms and 1 to 3 oxygen atoms.]

Examples of the compound represented by the general formula (10) include N-acryloyloxyethyl hexahydrophthalimide.

The negative photosensitive siloxane composition of an embodiment of the present invention contains a photopolymerization initiator (d). A "photopolymerization initiator" as used herein is a compound which undergoes degradation and/or reaction to generate a radical by light (including UV and electron beam).

Exemplary photopolymerization initiators include 2-methyl-1-[4-(methylthio)phenyl]-2-morpholinopropan-1-one, 2-dimethylamino-2-(4-methylbenzyl)-1-(4-morpholin-4-yl-phen yl)-butan-1-one, 2-benzyl-2-dimethylamino-1-(4-morpholinophenyl)-butanone-1,2,4,6-trimethylbenzoylphenylphosphine oxide, bis(2,4,6-trimethylbenzoyl)-phenylphosphine oxide, bis(2,6-dimethoxybenzoyl)-(2,4,4-trimethylpentyl)-phosphine oxide, 1-phenyl-1,2-propanedione-2-(o-ethoxycarbonyl)oxime, 1,2-octanedione,1-[4-(phenylthio)-2-(o-benzoyloxime)], 1-phenyl-1,2-butanedione-2-(o-methoxycarbonyl)oxime, 1,3-diphenylpropanetrione-2-(o-ethoxycarbonyl) oxime, ethanone,1-[9-ethyl-6-(2-methylbenzoyl)-9H-carbazol-3-yl]-1-(0-acetyloxime), 4,4-bis(dimethylamino) benzophenone, 4,4-bis(diethylamino)benzophenone, ethyl p-dimethylaminobenzoate, 2-ethylhexyl-p-dimethylaminobenzoate, ethyl p-diethylaminobenzoate, diethoxy acetophenone, 2-hydroxy-2-methyl-1-phenyl propan-1-one, benzyldimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexyl phenyl ketone, benzoin, benzoin methyl ether, benzoin ethyl ether, benzoin isopropyl ether, benzoin isobutyl ether, benzophenone, methyl o-benzoylbenzoate, 4-phenyl benzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl]benzene methane aminium bromide, (4-benzoyl benzyl)trimethylammonium chloride, 2-hydroxy-3-(4-benzoylphenoxy)-N,N,N-trimethyl-1-propene aminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propane aminium chloride, 2,2'-bis(o-chlorophenyl)-4,5,4',5'-tetraphenyl-1,2-biimidazole, 10-butyl-2-chloroacrydone, 2-ethylanthraquinone, benzyl-9,10-phenanthrene quinone, camphor quinone, methylphenyl glyoxyester, η5-cyclopentadienyl-η6-cumenyl-iron(1+)-hexafluorophosphate (1−), diphenyl sulfide derivatives, bis(η5-2,4-cyclopentadien-1-yl)-bis(2,6-difluoro-3-(1H-pyrrol-1-yl)-phenyl)titanium, thioxanthone, 2-methylthioxanthone, 2-chlorothioxanthone, 4-benzoyl-4-methylphenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzylmethoxyethyl acetal, anthraquinone, 2-t-butylanthraquinone, 2-aminoanthraquinone, β-chloroanthraquinone, anthrone, benzanthrone, dibenzsuberone, methylene anthrone, 4-azidobenzalacetophenone, 2,6-bis(p-azidobenzylidene)cyclohexane, 2,6-bis(p-azidobenzylidene)-4-methyl cyclohexanone, naphthalene sulfonyl chloride, quinoline sulfonyl chloride, N-phenylthioacridone, benzothiazole disulfide, triphenylphosphine, carbon tetrabromide, tribromophenylsulfone, benzoyl peroxide, and a combination of a photoreductive dye such as eosin or methylene blue and a reducing agent such as ascorbic acid or triethanolamine.

In view of improving hardness of the cured film, the preferred are α-aminoalkylphenone compounds, acyl phosphine oxide compounds, oxime ester compounds, benzophenone compounds having amino group, and benzoate ester compounds containing amino group.

Exemplary α-aminoalkylphenone compounds include 2-methyl-[4-(methylthio)phenyl]-2-morpholinopropan-1-one, 2-dimethylamino-2-(4-methylbenzyl)-1-(4-morpholin-4-yl-phenyl)-butan-1-one, and 2-benzyl-2-dimethylamino-1-(4-morpholinophenyl)-butanone-1.

Exemplary acyl phosphine oxide compounds include 2,4,6-trimethylbenzoylphenylphosphine oxide, bis(2,4,6-trimethylbenzoyl)-phenylphosphine oxide, and bis(2,6-dimethoxybenzoyl)-(2,4,4-trimethylpentyl)-phosphine oxide.

Exemplary oxime ester compounds include 1-phenyl-1,2-propanedione-2-(o-ethoxycarbonyl)oxime, 1,2-octanedione,1-[4-(phenylthio)-2-(o-benzoyloxime)], 1-phenyl-1,2-butanedione-2-(o-methoxycarbonyl)oxime, 1,3-diphenylpropanetrione-2-(o-ethoxycarbonyl)oxime or ethanone, and 1-[9-ethyl-6-(2-methylbenzoyl)-9H-carbazol-3-yl]-1-(0-acetyloxime).

Exemplary benzophenone compounds containing amino group include 4,4-bis(dimethylamino)benzophenone and 4,4-bis(diethylamino)benzophenone.

Exemplary benzoate ester compounds containing amino group include ethyl p-dimethylaminobenzoate, 2-ethylhexyl p-dimethylaminobenzoate, and ethyl p-diethylaminobenzoate.

The negative photosensitive resin composition of an embodiment of the present invention contains a compound containing maleimide group (e). The maleimide compound is a compound containing maleimide group, and this compound is known to undergo photodimerization which is neither affected by radical reaction nor oxygen hindrance in the exposure before the patterning, and accordingly, the photodimerization proceeds on the surface of the pattern which is in contact with the oxygen, and a reaction is more readily induced on a surface which had been less likely to undergo a reaction by radical reaction. In addition, the high hydrophobic nature results in the reduced dissolution of the surface by alkaline aqueous solutions, and this results in more rectangular cross-section of the pattern.

Exemplary maleimide compounds (e) include N-phenylmaleimide ("IMILEX-P" (registered trademark) manufactured by NIPPON SHOKUBAI Co., Ltd.), N-(4-aminophenyl)maleimide, N-[4-(2-benzimidazolyl)phenyl]maleimide, 1,4-bis(maleimide)butane, 1,2-bis(maleimide)ethane, 4,4'-bismaleimide diphenylmethane, 1,2-bis(maleimide)ethane, 1,6-bis(maleimide)hexane, N-t-butylmaleimide, N-cyclohexylmaleimide, N-ethylmaleimide, fluorecein-5-maleimide, 4-maleimide butanoic acid, 6-maleimide hexanoic acid, 3-maleimide propionic acid, N-methoxycarbonyl maleimide, phenylmethane maleimide, m-phenylene bismaleimide, bisphenol A diphenyl ether bismaleimide, 3,3'-dimethyl-5,5'-diethyl-4,4'-diphenyl-methane bismaleimide, 4-methyl-1,3-phenylene bismaleimide, 1,6'-bismaleimide-(2,2,4-trimethyl)hexane, 4,4'-diphenyl ether bismaleimide, 4,4'-diphenyl sulfone bismaleimide, 1,3-bis(3-maleimide phenoxy)benzene, 1,3-bis(4-maleimide phenoxy)benzene (Daiwa Fine Chemicals Co., Ltd.), 4,4'-diphenylmethane bismaleimide (BMI), bis-(3-ethyl-5-methyl-4-maleimide phenyl)methane (BMI-70), and 2, 2'-bis[4-(4-maleimide phenoxy)phenyl]propane (K.I Chemical Industry Co., Ltd.). Since the molecular weight increases by the photodimerization reaction, the more preferred is a compound having two or more maleimide groups. The content is preferably at least 4 parts by weight when total content of the metallic compound particles (a), the polysiloxane compound (b), and the compound having at least 1 group containing an α,β-unsaturated carboxylate ester structure (c) is 100 parts by weight in view of improving the chemical resistance by the photocuring reaction. In addition, the maleimide compound may preferably have a molecular weight of up to 2000 and more preferably up to 800 in view of the higher compatibility with the polysiloxane compound (b) and stronger photoreaction in the photocuring.

The negative photosensitive resin composition of the present invention preferably contains a solvent (f). Although the solvent is not particularly limited, the solvent is preferably a compound having an alcoholic hydroxy group (the solvent when a compound having an alcoholic hydroxy group is used for the solvent is hereinafter abbreviated as "a solvent having an alcoholic hydroxy group"). When a solvent having an alcoholic hydroxy group is used, stability of the polysiloxane compound (b) will be improved, and the coating film obtained by using the negative photosensitive resin composition will have an improved transparency.

The solvent having an alcoholic hydroxy group is not particularly limited. However, the preferred are those having a boiling point at atmospheric pressure of 110 to 250° C. (the "boiling point at atmospheric pressure" is abbreviated as the "boiling point"). When the boiling point is at least 110° C., suitable drying in the formation of the coating film will be facilitated and the resulting coating film will have a good surface appearance. On the other hand, solvent removal will be facilitated when the boiling point is up to 250° C.

Exemplary solvents having an alcoholic hydroxy group include acetol (boiling point, 147° C.), 3-hydroxy-3-methyl-2-butanone (boiling point, 140° C.), 4-hydroxy-3-methyl-2- butanone (boiling point, 73° C.), 5-hydroxy-2-pentanone (boiling point, 144° C.), 4-hydroxy-4-methyl-2-pentanone (diacetone alcohol) (boiling point, 166° C.), ethyl lactate (boiling point, 151° C.), butyl lactate (boiling point, 186° C.), propylene glycol monomethyl ether (boiling point, 118° C.), propylene glycol monoethyl ether (boiling point, 132° C.), propylene glycol mono-n-propyl ether (boiling point, about 150° C.), propylene glycol mono-n-butyl ether (boiling point, 170° C.), diethylene glycol monomethyl ether (boiling point, 194° C.), diethylene glycol monoethyl ether (boiling point, 202° C.), dipropylene glycol monomethyl ether (boiling point, about 190° C.), 3-methoxy-1-butanol (boiling point, 161° C.), and 3-methyl-3-methoxy-1-butanol (boiling point, 174° C.), which may be used in combination of two or more.

Other solvents may be used with or instead of the solvent having an alcoholic hydroxy group. Exemplary such other solvents include esters such as ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, ethyl acetoacetate; ketones such as methyl isobutyl ketone, diisopropyl ketone, diisobutyl ketone, and acetyl acetone; ethers such as diethyl ether, diisopropyl ether, di-n-butyl ether, diphenyl ether, diethylene glycol ethyl methyl ether, and diethylene glycol dimethyl ether; and γ-butyrolactone, γ-valerolactone, δ-valerolactone, propylene carbonate, N-methyl pyrrolidone, cyclopentanone, cyclohexanone, and cycloheptanone.

The content of the solvent (f) when the negative photosensitive resin composition of the present invention contains the solvent (f) is not particularly limited. However, the content is preferably 100 to 2,000 parts by weight in relation to the total amount of the metallic compound particles (a) and the polysiloxane compound (b).

The negative photosensitive resin composition of the present invention may also contain various surfactants such as fluorosurfactants and silicone surfactants for the improvement of flowability in the coating. The type of the surfactant used is not particularly limited, and examples include fluorosurfactants such as "MEGAFACE (registered trademark)" F142D, MEGAFACE F172, MEGAFACE F173, MEGAFACE F183, MEGAFACE F445, MEGAFACE F470, MEGAFACE F475, and MEGAFACE F477 (products manufactured by Dainippon Ink and Chemicals, Incorporated), NBX-15, FTX-218, DFX-18 (manufactured by Neos Co., Ltd.), silicone surfactants such as BYK-333, BYK-301, BYK-331, BYK-345, and BYK-307 (manufactured by BYK Japan KK), polyalkylene oxide surfactant, and poly(meth)acrylate surfactant. These surfactants may be used in combination of two or more.

If desired, the negative photosensitive resin composition of the present invention may further comprise additives such as silane coupling agent, crosslinking agent, crosslink promoter, sensitizer, thermal radical generator, dissolution promoter, dissolution suppressor, stabilizer, and defoaming agent.

The cured film of the present invention is prepared by curing the negative photosensitive resin composition of the present invention. More specifically, the cured film of the present invention can be obtained by coating the negative photosensitive resin composition of the present invention on a substrate, exposing and developing the coating, and then curing the coating by heating. Next, the cured film of the present invention is described by referring to exemplary embodiments. However, the cured film is not limited to those obtained by the conditions described in these cases as long as equivalent effects are realized.

The negative photosensitive resin composition of an embodiment of the present invention is coated on a substrate by a known method such as spin coating or slit coating, and the coating is heated (prebaked) by using a heater such as hotplate or oven to evaporate the solvent in the composition. The prebaking is preferably conducted at a temperature in the range of 50 to 150° C. for 30 seconds to 30 minutes. The film thickness after the prebaking is preferably 0.1 to 15 μm.

After the prebaking, the exposure is conducted to an approximately 10 to 4000 J/m$^2$ (wavelength 365 nm in terms of exposure) by using a UV-visible exposure apparatus such as a stepper, mirror projection mask aligner (MPA), or parallel light mask aligner (PLA) and an intervening mask of desired type to promote crosslinking of the exposed area to thereby reduce the solubility of the exposed area or insolubilize the exposed area to the developer solution.

After the exposure, the areas which were not exposed are removed by dissolution in the development to obtain the negative pattern, which preferably has a pattern resolution of up to 8 μm. The development is conducted by immersion in a developer solution for 5 seconds to 10 minutes by the procedure such as shower, dip, puddle. The developer solution used may be a known alkaline developer, and examples include aqueous solutions of inorganic alkalis such as hydroxide, carbonate salt, phosphate salt, silicate salt, or borate salt of an alkaline metal; amines such as 2-diethylaminoethanol, monoethanolamine, and diethanolamine; quaternary ammonium salts such as tetramethylammonium hydroxide (TMAH) and choline; which may be used in combination of two or more. After the development, the coating is preferably rinsed with water followed by optional baking for dehydration and drying at a temperature in the range of 50 to 150° C. in a heating apparatus such as hot plate or oven.

The thus developed film is optionally heated (soft baking) at a temperature in the range of 50 to 250° C. for 30 seconds to 30 minutes in a heating apparatus such as hot plate or oven and then heated (cured) at a temperature in the range of 150 to 450° C. for 30 seconds to 2 hours in a heating apparatus such as hot plate or oven to thereby obtain the cured film.

The negative photosensitive resin composition of the present invention may preferably have a sensitivity in the exposure of up to 1500 J/m$^2$, and more preferably up to 1500 J/m$^2$ in view of the productivity in the patterning. Such high sensitivity is readily realized by the use of a negative photosensitive resin composition containing a polysiloxane compound using an organosilane having carboxyl group and/or dicarboxylic anhydride structure.

The sensitivity in the exposure is determined by the following procedure. First, a negative photosensitive resin composition was coated on a silicon wafer by spin coating using a spin coater at any rotation number, and the coating was subjected to prebaking at 120° C. for 3 minutes by using a hot plate to form a prebaked film having film thickness of 1 μm. After exposing the prebaked film to an ultra-high pressure mercury lamp using PLA (PLA-501F manufactured by CANON) with an intervening gray scale mask having a line-and-space-pattern for sensitivity measurement (1 to 10 μm), the film was developed by shower development in an automatic developer (AD-2000 manufactured by Takizawa Co., Ltd.) by using a 2.38% by weight TMAH aqueous solution for 90 seconds and rinsed with water for 30 seconds. In the thus pattern formed, the exposure at which square patterns (design size, 100 μm) are left formed on the substrate without being peeled off after the exposure (this exposure is hereinafter referred to as the optimal exposure) was determined, and this value is used for the exposure sensitivity.

A thermal curing step was then conducted by conducing the curing at 220° C. for 5 minutes by using a hot plate to prepare a cured film, and the minimum pattern size at the exposure sensitivity was used for the resolution after curing.

The cured film prepared by curing the negative photosensitive resin composition of the present invention preferably has a light transmittance per film thickness of 1 at the wavelength 400 nm of at least of 90%, and preferably at least 92%. In the present invention, the "transmittance" is used for the index of transparency. Such high transmittance is readily realized by using a negative photosensitive resin composition prepared by using a highly transparent polysiloxane compound for the resin component. When the film thickness actually measured is 1 μm, the light transmittance at such film thickness is used for the "light transmittance per film thickness of 1 μm", and when the film thickness actually measured is not 1 μm, the value converted to the value at the film thickness of 1 μm is used for the "light transmittance per film thickness of 1 μm".

The transmittance of the cured film per film thickness of 1 μm at a wavelength of 400 nm is determined by the following procedure. First, the negative photosensitive resin composition is coated by spin coating on a Tempax glass plate by using a spin coater at any rotation number, and the coating is prebaked at 100° C. for 3 minutes by using a hot plate. The coating is thermally cured in atmosphere at 220° C. for 5 minutes by using a hot plate to produce a cured film having a film thickness of 1 μm. The resulting cured film is evaluated for its UV-visible absorption spectrum by using MultiSpec-1500 manufactured by Shimadzu Corporation to calculate the transmittance at a wavelength of 400 nm. In another procedure, the transmittance is determined by measuring the extinction coefficient k and the film thickness t of the cured film by each wavelength λ using spectroscopic ellipsometer FE5000 manufactured by Otsuka Electronics Co., Ltd., and conducting the calculation by the following equation:

$$\text{Transmittance} = \exp(-4\pi k t/\lambda)$$

It is to be noted that, when the cured film produced has a film thickness unequal to 1 μm, the transmittance per film thickness of 1 μm may be calculated by the following equation:

$$\text{Transmittance per film thickness of 1 μm} = \{(\text{transmittance}/100)^{\wedge}(1/t)\} * 100$$

wherein k is the extinction coefficient, t is the film thickness (μm), and λ is the wavelength (nm) used for the measurement.

The negative photosensitive resin composition and the cured film of the present invention are adapted for use in an optical device such as image sensor (solid-state image sensing device), optical filter, display, or LED luminaire. Of the optical device equipped with the cured film of the present invention, the most preferred include LED luminaries. LED luminaire is a luminaire using a light-emitting diode. The light-emitting diode is a type of EL (Electro Luminescence) device which converts electric energy to optical energy by the characteristic nature of the compound semiconductor, and those using Group III to V compound semiconductor are already on the market. These Group III to V compound semiconductors are direct transition semiconductors which are capable of undergoing stable operation at high temperature compared to other semiconductors. The Group III to V compound semiconductors are also used in various luminaire devices, illuminations, and electric appliance due to the high energy conversion efficiently and long life. In order to take most light out of such light-emitting diode, the negative photosensitive resin composition of the present invention is used to make a film having a high refractive index or a pattern having a refractive index to realize a brighter LED luminaire with reduced power consumption.

Another preferable example of the optical device equipped with the cured film of the present invention is an image sensor, and more specifically, a condenser micro-lens and an optical waveguide formed in a solid-state image sensing device such as an image sensor and an antireflective film provided as an optical filter. Of these, the most preferred is use of the cured film as condenser micro-lens formed on the solid-state image sensing device and optical waveguide connecting the condenser micro-lens and the optical sensor section in view of the high transparency simultaneously realized with high refractive index.

The image sensor equipped with the cured film of the present invention is preferably a backside illuminated CMOS image sensor which at least has a photoelectric conversion layer, a color filter, and a flattening layer in this order, wherein the color filter has colored pixels divided by the pattern obtained by using the negative photosensitive resin composition of the present invention, and wherein refractive index of the flattening layer is smaller than the refractive index pattern. The negative composition of the present invention is capable of forming a shape with high taper angle, and therefore, it can be used for the material of the transparent partition of the colored pixel in the image sensor to divide the colored pixel, and by providing a flattening layer having a lower refractive index thereon, the light collection efficiency can be improved by the refractive index difference and the transparent partition.

Other preferable examples of the optical device equipped with the cured film of the present invention include flattening layer of a TFT substrate for display, color filter and its protective film for liquid crystal display, and phase shifter. The cured film is also applicable for buffer coating, interlayer insulative film, and various protective films in semiconductor apparatus. In addition, the negative photosensitive resin composition of the present invention does not require the patterning by etching method, and production by a simple procedure is thereby enabled, and deterioration of the wiring by chemical solution or plasma in the etching is also avoided.

EXAMPLES

Next, the present invention is described in further detail by referring to Examples, which by no means limit the scope of the present invention. In Synthetic Examples and Examples, following abbreviation for the compounds were used.

PGMEA: propylene glycol monomethyl ether acetate
DAA: diacetone alcohol

The solid concentration of the polysiloxane compound solution was determined by weighing 1.5 g of the polysiloxane compound solution in an aluminum cup, heating the solution at 250° C. for 30 minutes by using a hot plate for evaporation of the liquid content, and weighing the solid content remaining in the aluminum cup after the heating to thereby determine the solid concentration of the polysiloxane compound solution.

Synthetic Example 1

Synthesis of Carboxyl Group-Containing Silane Compound (A)

23.23 g of p-aminobenzoic acid and 209.05 g of PGMEA were charged in a 300 ml recovery flask, and the mixture was stirred at room temperature for 30 minutes to dissolve the p-aminobenzoic acid. To the resulting solution, 46.53 g of isocyanate propyltriethoxysilane and 1.19 g of dibutyltin dilaurate were added, and the mixture was stirred in an oil bath at 70° C. for 1 hour. The mixture was then allowed to cool to room temperature, and precipitated solid was collected by filtration through a glass filter and dried to obtain carboxyl group-containing silane compound (A). The yield was 46.7 g.

Synthetic Example 2

Synthesis of Carboxyl Group-Containing Silane Compound (B)

23.39 g of p-hydroxybenzoic acid and 210.5 g of PGMEA were charged in a 300 ml recovery flask, and the mixture was stirred at room temperature for 30 minutes to dissolve the p-hydroxybenzoic acid. To the resulting solution, 46.53 g of isocyanate propyltriethoxysilane and 1.19 g of dibutyltin dilaurate were added, and the mixture was stirred in an oil bath at 40° C. for 3 hour. The mixture was then allowed to cool to room temperature, and precipitated solid was collected by filtration through a glass filter and dried to obtain carboxyl group-containing silane compound (B). The yield was 42.4 g.

Preparation Example 1

Preparation of a Solution of Polysiloxane Compound (b) Having Metallic Compound Particles (a) Dispersed Therein (the Procedure Includes the Step of Synthesizing the Polysiloxane Compound, and this Also Applies to the Following Preparation Examples)

To 500 ml 3-neck flask, 7.03 g (0.03 mole) of 3-acryloxypropyltrimethoxysilane, 15.37 g (0.04 mole) of carboxyl group-containing silane compound (A), 7.45 g (0.03 mole) of 1-naphthyltrimethoxysilane, 156 g of "OptLake" (registered trademark) TR-527 (product name, manufactured by JGC Catalysts and Chemicals Ltd.) having a number average particle diameter of 15 nm (dispersion of titanium oxide-silicon oxide composite particles in methanol (20.6% by weight)) (particle content of 150 parts by weight in relation to 100 parts by weight (22.3 g) of the organosilane after complete condensation), and 83.84 g of DAA were charged, and to this mixture, an aqueous solution of phosphoric acid prepared by dissolving 0.217 g of phosphoric acid in 5.4 g of water was added in 10 minutes with stirring at room temperature. The number average particle diameter was measured by dynamic light scattering method by using Dynamic Light Scattering Spectrophotometer DLS-8000 (manufactured by Otsuka Electronics Co., Ltd.).

The flask was then placed in an oil bath at 40° C., and after stirring the mixture for 60 minutes, the temperature of the oil bath was heated to 115° C. in 30 minutes. Internal temperature of the solution reached 100° C. at 1 hour after the start of the heating, and the stirring was continued for 2 hours with heating (internal temperature being 100 to 110° C.) to obtain a solution of polysiloxane compound (b) having titanium oxide-silicon oxide composite particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 1 are together referred to as "PS-01". In other words, the parts by weight of the PS-01 is the total amount (parts by weight) of the metallic compound particles (a) and the polysiloxane compound (b) in the solution which does not include the solvent and other components (This also applies to the following PS-02 to PS-09).

Preparation Example 2

Preparation of a Solution of Polysiloxane Compound (b) having Metallic Compound Particles (a) Dispersed therein To 500 ml 3-neck flask, 5.86 g (0.025 mole) of 3-acryloxypropyltrimethoxysilane, 19.26 g (0.05 mole) of carboxyl group-containing silane compound (B), 6.21 g (0.025 mole) of 1-naphthyltrimethoxysilane, 181.4 g of (registered trademark) NOD-7771GTB (product name, manufactured by Nagase ChemteX Corporation) having a number average particle diameter of 25 nm (dispersion of titanium oxide particles in propylene glycol monomethyl ether acetate (20.2% by weight)) (particle content of 150 parts by weight in relation to 100 parts by weight (24.4 g) of the organosilane after complete condensation), and 89.12 g of DAA were charged, and to this mixture, an aqueous solution of phosphoric acid prepared by dissolving 0.157 g of phosphoric acid in 5.4 g of water was added in 10 minutes with stirring at room temperature. The mixture was then heated and stirred by repeating the procedure of Preparation Example 1 to obtain a solution of polysiloxane compound (b) having titanium oxide particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 2 are together referred to as "PS-02".

Preparation Example 3

Preparation of a Solution of Polysiloxane Compound (b) having Metallic Compound Particles (a) Dispersed therein To 500 ml 3-neck flask, 5.61 g (0.025 mole) of p-styryltrimethoxysilane, 19.21 g (0.05 mole) of carboxyl group-containing silane compound (B), 7.45 g (0.025 mole) of 1-anthracenyltrimethoxysilane, 175.7 g of "OptLake" (registered trademark) TR-550 (product name, manufactured by JGC Catalysts and Chemicals Ltd.) having a number average particle diameter of 20 nm (dispersion of titanium oxide-silicon oxide composite particles in methanol (20.6% by weight)) (particle content of 150 parts by weight in relation to 100 parts by weight (24.1 g) of the organosilane after complete condensation), and 88.03 g of DAA were charged, and to this mixture, an aqueous solution of phosphoric acid prepared by dissolving 0.155 g of phosphoric acid in 5.4 g of water was added in 10 minutes with stirring at room temperature. The mixture was then heated and stirred by repeating the procedure of Preparation Example 1 to obtain a solution of polysiloxane compound (b) having titanium oxide-silicon oxide composite particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 3 are together referred to as "PS-03".

Preparation Example 4

Preparation of a Solution of Polysiloxane Compound (b) having Metallic Compound Particles (a) Dispersed therein To 500 ml 3-neck flask, 11.22 g (0.05 mole) of p-styryl-trimethoxysilane, 6.56 g (0.025 mole) of 3-trimethoxysilylpropyl succinate, 6.21 g (0.025 mole) of 1-naphthylsilane, 112.38 g of "NanoUse" (registered trademark) OZ-30M (manufactured by Nissan Chemical Industries, Limited) having a number average particle diameter of 7 nm) (dispersion of titanium oxide particles (23.4% by weight)) (particle content of 150 parts by weight in relation to 100 parts by weight (17.5 g) of the organosilane after complete condensation), and 64.63 g of DAA were charged, and to this mixture, an aqueous solution of phosphoric acid prepared by dissolving 0.120 g of phosphoric acid in 5.85 g of water was added in 10 minutes with stirring at room temperature. The mixture was then heated and stirred by repeating the procedure of Preparation Example 1 to obtain a solution of polysiloxane compound (b) having titanium oxide particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 4 are together referred to as "PS-04".

Preparation Example 5

Preparation of a Solution of Polysiloxane Compound (b) having Metallic Compound Particles (a) Dispersed therein To 500 ml 3-neck flask, 11.22 g (0.05 mole) of p-styryl-trimethoxysilane, 6.56 g (0.025 mole) of 3-trimethoxysilylpropyl succinate, 6.21 g (0.025 mole) of 1-naphthylsilane, 112.38 g of "NanoUse" (registered trademark) OZ-30M (manufactured by Nissan Chemical Industries, Limited) having a number average particle diameter of 7 nm) (dispersion of titanium oxide particles (23.4% by weight)) (particle content of 150 parts by weight in relation to 100 parts by weight (18.9 g) of the organosilane after complete condensation), and 64.63 g of DAA were charged, and to this mixture, an aqueous solution of phosphoric acid prepared by dissolving 0.120 g of phosphoric acid in 5.85 g of water was added in 10 minutes with stirring at room temperature. The mixture was then heated and stirred by repeating the procedure of Preparation Example 1 to obtain a solution of polysiloxane compound (b) having titanium oxide particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 5 are together referred to as "PS-05".

Preparation Example 6

Preparation of a Solution of Polysiloxane Compound (b) having Metallic Compound Particles (a) Dispersed therein 13.02 g (0.05 mole) of 3-methacryloxypropyltrimethoxysilane, 6.56 g (0.025 mole) of 3-trimethoxysilylpropyl succinate, 7.45 g (0.025 mole) of 1-anthracenyltrimethoxysilane, and 149.86 g of "OptLake" (registered trademark) TR-550 (product name, manufactured by JGC Catalysts and Chemicals Ltd.) having a number average particle diameter of 20 nm (dispersion of titanium oxide-silicon oxide composite particles in methanol (20.6% by weight)) (particle content of 150 parts by weight in relation to 100 parts by weight (20.6 g) of the organosilane after complete condensation), and 75.89 g of DAA were charged, and to this mixture, an aqueous solution of phosphoric acid prepared by dissolving 0.135 g of phosphoric acid in 5.85 g of water was added in 10 minutes with stirring at room temperature. The mixture was then heated and stirred by repeating the procedure of Preparation Example 1 to obtain a solution of polysiloxane compound (b) having titanium oxide-silicon oxide composite particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 6 are together referred to as "PS-06".

Preparation Example 7

Preparation of a Solution of Polysiloxane Compound (b) having Metallic Compound Particles (a) Dispersed therein To 500 ml 3-neck flask, 5.45 g (0.04 mole) of methyltrimethoxysilane, 9.9 g (0.05 mole) of phenyltrimethoxysilane, 2.6 g (0.01 mole) of 3-trimethoxysilylpropyl succinate, and 76.9 g of "OptLake" (registered trademark) TR-527 (product name, manufactured by JGC Catalysts and Chemicals Ltd.) having a number average particle diameter of 20 nm (dispersion of titanium oxide-silicon oxide composite particles in methanol (22.0% by weight)) (particle content of 150 parts by weight in relation to 100 parts by weight (20.5 g) of the organosilane after complete condensation), and 40.7 g of DAA were charged, and to this mixture, an aqueous solution of phosphoric acid prepared by dissolving 0.09 g of phosphoric acid in 5.6 g of water was added in 10 minutes with stirring at room temperature. The mixture was then heated and stirred by repeating the procedure of Preparation Example 1 to obtain a solution of polysiloxane compound (b) having titanium oxide-silicon oxide composite particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 7 are together referred to as "PS-07".

Preparation Example 8

Preparation of a Solution of Polysiloxane Compound (b) having Metallic Compound Particles (a) Dispersed therein To 500 ml 3-neck flask, 5.45 g (0.04 mole) of methyltrimethoxysilane, 5.25 g (0.02 mole) of 3-trimethoxysilylpropyl succinate, 9.93 g (0.04 mole) of 1-naphthyltrimethoxysilane, and 102.6 g of "OptLake" (registered trademark) TR-550 (product name, manufactured by JGC Catalysts and Chemicals Ltd.) having a number average particle diameter of 20 nm (dispersion of titanium oxide-silicon oxide composite particles in methanol (20.6% by weight)) (particle content of 150 parts by weight in relation to 100 parts by weight (14.1 g) of the organosilane after complete condensation), and 52.3 g of DAA were charged, and to this mixture, an aqueous solution of phosphoric acid prepared by dissolving 0.103 g of phosphoric acid (0.50% by weight in relation to the amount of monomers charged) in 5.76 g of water was added in 10 minutes with stirring at room temperature. The mixture was then heated and stirred by repeating the procedure of Preparation Example 1 to obtain a solution of polysiloxane compound (b) having titanium oxide-silicon oxide composite particles dispersed therein as metallic compound particles (a) The resulting solution was diluted by DAA to a solid concentration of 35% by weight. In the composition of the Examples, the metallic compound particles (a) and the polysiloxane compound (b) in the solution obtained in Preparation Example 8 are together referred to as "PS-08".

Preparation Example 9

Preparation of a Solution of Polysiloxane Compound (b) having Metallic Compound Particles (a) Dispersed therein To 500 ml 3-neck flask, 5.86 g (0.025 mole) of 3-acryloxypropyltrimethoxysilane, 19.26 g (0.05 mole) of carboxyl group-containing silane compound (B), 4.96 g (0.025 g) of phenyltrimethoxysilane, 172.1 g of (registered trademark) NOD-7771GTB (product name, manufactured by Nagase ChemteX Corporation) having a number average particle diameter of 25 nm) (dispersion of titanium oxide particles in propylene glycol monomethyl ether acetate (20.2% by weight)) (particle content of 150 parts by weight in relation to 100 parts by weight (23.2 g) of the organosilane after complete condensation), and 89.12 g of DAA were charged, and to this mixture, an aqueous solution of phosphoric acid prepared by dissolving 0.157 g of phosphoric acid in 5.4 g of water was added in 10 minutes with stirring at room temperature. The mixture was then heated and stirred by repeating the procedure of Preparation Example 1 to obtain a solution of polysiloxane compound (b) having titanium oxide particles dispersed therein as metallic compound particles (a). The resulting solution was diluted by DAA to a solid concentration of 35% by weight. In the composition of the Examples, the metallic compound particles (a) and the polysiloxane compound (b) in the solution obtained in Preparation Example 10 are together referred to as "PS-09".

The resulting negative photosensitive resin compositions were evaluated by the procedures as described below. The evaluations were conducted at n=2, and their averages are shown in Table 8 to 10.
(1) Film Thickness
Thickness of the prebaked film, thickness of the exposed area of the film after the development, and the thickness of the cured film were evaluated by using Lambda Ace STM-602 (product name, manufactured by Dainippon Screen Mfg. Co., Ltd.) at a refractive index of 1.70.

(2) Residual Film Rate
Residual film rate was calculated by the following equation.

Residual film rate (%)={(thickness of the exposed area of the film after the development)/(thickness of the prebaked film)}×100

(3) Calculation of Exposure Sensitivity
The resulting prebaked film was subjected to patterned exposure by an ultra-high pressure mercury lamp using PLA (PLA-501F manufactured by CANON) with an intervening gray scale mask for sensitivity measurement (Multi density Resolution Mask manufactured by Opto-Line). The minimum exposure at which square patterns (design size, 100 µm) are left formed without being peeled off after the development was used for the exposure sensitivity.
(4) Resolution
Square patterns were observed in the resulting film after the development at every exposure level, and the minimum pattern size was used for the resolution after the development. Similarly, all square patterns were observed in the resulting cured film, and the minimum pattern size was used for the resolution after the curing.
(5) Refractive Index
The resulting cured film was measured for refractive index at 22° C. and 550 nm by using a spectroscopic ellipsometer FE5000 manufactured by Otsuka Electronics Co., Ltd.
(6) Light Transmittance (at a Wavelength of 400 nm, per 1 µm)
Extinction coefficient of the resulting cured film at a wavelength of 400 nm was measured by a spectroscopic ellipsometer FE5000 manufactured by Otsuka Electronics Co., Ltd., and the light transmittance (%) converted to the film thickness of 1 µm at a wavelength of 400 nm was calculated by the following equation:

$$\text{Light transmittance} = \exp(-4\pi kt/\lambda)$$

wherein k is the extinction coefficient, t is the film thickness (µm), and λ is the wavelength (nm) used for the measurement. It is to be noted that, when the cured film produced has a film thickness unequal to 1 µm, the transmittance per film thickness of 1 µm was calculated by the following equation:

$$\text{Transmittance per film thickness of 1 µm} = \{(\text{transmittance}/100)^{\wedge}(1/t)\}*100$$

(7) Solvent Resistance
The resulting cured film was immersed in PGMEA solvent at 25° C. for 2 minutes, and the cured film was evaluated (A) excellent when the residual film rate was at least 99%, (B) good when the residual film rate was at least 95%, (D) poor when residual film rate was less than 95%. The residual film rate was calculated by the following equation:

Residual film rate (%)=(film thickness after immersing in PGMEA solvent/film thickness before immersing in PGMEA solvent)×100

The film thickness was measured by the procedure described in the "(1) Film thickness" as described above.
(8) Taper Angle
The exposure was conducted by using a check patterned mask (1.5 µm square), and the patterned cured film was evaluated for the taper angle of the pattern cross-section from the SEM picture of the cross section taken at each exposure level. The taper angle was evaluated D when the 1.5 µm pattern was not resolved at any exposure level, C when the highest taper angle in all exposure levels was 45° to 60°, B when it was 60° to 75°, and A when it was 75° to 90°

Example 1

The components were mixed at the ratio as shown in composition 1 of Table 1, and 30 ppm of DFX-18 (manufactured by Neos Co., Ltd.) was added as a fluorosurfactant. The mixing and the stirring were carried out under yellow light to prepare a consistent solution, and the solution was filtered through a 0.20 µm filter to prepare composition 1.

The composition 1 immediately after its preparation was coated on an 8-inch silicon wafer by using a spin coater (1H-360S manufactured by Mikasa) and heated at 100° C. for 3 minutes by using a hot plate (SCW-636 manufactured by Dainippon Screen Mfg. Co., Ltd.) to prepare a prebaked film having a film thickness of 1.0 µm. The resulting prebaked film was subjected to (1) measurement of the film thickness and (3) calculation of the exposure sensitivity.

Exposure of the resulting prebaked film was conducted by using i-linestepper (i9C manufactured by Nikon) at an increment of 50 msec from 100 msec to 1000 msec. After the exposure, the film was developed by shower development in an automatic developer (AD-2000 manufactured by Takizawa Co., Ltd.) using a 2.38% by weight TMAH aqueous solution for 90 seconds and rinsed with water for 30 seconds to produce film after the development 1. The film was then cured at 220° C. for 5 minutes by using a hot plate to produce the cured film 1, and (4) resolution and (8) taper angle were evaluated by using the resulting film after the development 1 and the cured film 1.

The entire surface of the resulting prebaked film was exposed to an ultra-high pressure mercury lamp of 1500 J/m$^2$ by using PLA (PLA-501F manufactured by Canon) After the exposure, the film was developed by shower development in an automatic developer (AD-2000 manufactured by Takizawa Co., Ltd.) by using a 2.38% by weight TMAH aqueous solution for 90 seconds and rinsed with water for 30 seconds to produce the film after the development 2. The film was then cured at 220° C. for 5 minutes by using a hot plate to produce the cured film 2.

First, (1) measurement of the film thickness was conducted by using the resulting film after the development 2 and cured film 2. Also, (2) calculation of the residual film rate was conducted by using the film thickness measurements of the prebaked film and the film after the development 2. In addition, (5) calculation of the refractive index, (6) measurement of the light transmittance, and (7) evaluation of the solvent resistance were conducted by using the resulting cured film 2. The results are shown in Table 7.

Examples 2 to 14 and Comparative Examples 1 to 21

The procedure of Example 1 was repeated except that the components of the composition were changed to those shown in Tables 1 to 6 to prepare compositions 2 to 35. By using the resulting compositions, the prebaked film, the film after the development, and the cured film were prepared and the evaluation was carried out by repeating the procedure of Example 1. The results of the evaluation are shown in Tables 7 to 9.

When the film was totally dissolved and the evaluation could not be conducted in (5) calculation of refractive index, (6) measurement of light transmittance, and (7) evaluation of solvent resistance, the cured film was prepared and evaluated by repeating the procedure of Example 1 except that the development was not conducted.

TABLE 1

| | Composition No. | (a) Metal compound particles + (b) Polysiloxane compound Type (parts by weight) | Ratio of carboxyl group in the polysiloxane compound and/or organosilane containing dicarboxylic anhydride | (c) Compound having at least 1 group containing an α,β-unsaturated carboxylate ester | | (d) Photopolymerization initiator Type (parts by weight) | (e) Maleimide group-containing compound Type (parts by weight) | (f) Solvent Type (parts by weight) | Other additives Type content |
|---|---|---|---|---|---|---|---|---|---|
| | | | | Compound not corresponding to general formulae (5) to (10) Type (parts by weight) | Compound corresponding to general formulae (5) to (10) Type (parts by weight) | | | | |
| Ex. 1 | 1 | PS-01 (90) | 15 mol % | ethoxylated o-phenylphenol acrylate (10) | — | 2-methyl-1-(4-methylthiophenyl)-2-morpholino-propan-1-one (4) | bis-(3-ethyl-5-methyl-4-maleimide-phenyl)methane (5) | DAA (225) PGMEA (97) | DFX-18 30 ppm |
| Ex. 2 | 2 | PS-01 (85) | 15 mol % | — | dimethyloltri-cyclodecane diacrylate (15) | 2-methyl-1-(4-methylthiophenyl)-2-morpholino-propan-1-one (6) | bis-(3-ethyl-5-methyl-4-maleimide-phenyl)methane (5) | DAA (225) PGMEA (97) | DFX-18 30 ppm |
| Ex. 3 | 3 | PS-01 (90) | 15 mol % | — | 1-naphthyl acrylate (10) | 2-methyl-1-(4-methylthiophenyl)-2-morpholino-propan-1-one (6) | 4-methyl-1,3-phenylene bismaleimide, 1,6'-bismaleimide-(2,2,4-trimethyl)hexane (3) | DAA (225) PGMEA (97) | DFX-18 30 ppm |

TABLE 1-continued

| | | (a) Metal compound particles + (b) Polysiloxane compound | | (c) Compound having at least 1 group containing an α,β-unsaturated carboxylate ester | | | (e) Maleimide | | |
|---|---|---|---|---|---|---|---|---|---|
| | Composition No. | Type (parts by weight) | Ratio of carboxyl group in the polysiloxane compound and/or organosilane containing dicarboxylic anhydride | Compound not corresponding to general formulae (5) to (10) Type (parts by weight) | Compound corresponding to general formulae (5) to (10) Type (parts by weight) | (d) Photopolymerization initiator Type (parts by weight) | group-containing compound Type (parts by weight) | (f) Solvent Type (parts by weight) | Other additives Type content |
| Ex. 4 | 4 | PS-01 (95) | 15 mol % | — | 1-naphthyl acrylate (2.5), 1,4-ethylene oxide diacrylate naphthalene (2.5) | 2-methyl-1-(4-methylthiophenyl)-2-morpholino-propan-1-one (4) | 3,3'-dimethyl-5,5'-diethyl-4,4'-diphenyl-methane-bismaleimide (0.5) | DAA (225) PGMEA (97) | DFX-18 30 ppm |
| Ex. 5 | 5 | PS-01 (90) | 15 mol % | — | 1-naphthyl acrylate (7.5), 1,4-ethylene oxide diacrylate naphthalene (2.5) | 2-methyl-1-(4-methylthiophenyl)-2-morpholino-propan-1-one (6) | 1,2-bis(maleimide)ethane (2) | DAA (225) PGMEA (97) | DFX-18 30 ppm |
| Ex. 6 | 6 | PS-01 (80) | 15 mol % | dipenta-erythritol hexaacrylate (10) | 9,9-bis[4-(2-acryloyl-oxyethoxy)phenyl]fluorene (10) | 2-methyl-1-(4-methylthiophenyl)-2-morpholino-propan-1-one (4) | N-methoxy carbonyl maleimide (5) | DAA (225) PGMEA (97) | DFX-18 30 ppm |
| Ex. 7 | 7 | PS-01 (90) | 15 mol % | — | norbornene ethylene diacrylate (10) | 2-methyl-1-(4-methylthiophenyl)-2-morpholino-propan-1-one (6) | bis-(3-ethyl-5-methyl-4-maleimide-phenyl)methane (5) | DAA (225) PGMEA (97) | DFX-18 30 ppm |
| Ex. 8 | 8 | PS-01 (90) | 15 mol % | trimethylol-propane EO-modified triacrylate (2) | adamantane diacrylate (8) | 2-methyl-1-(4-methylthiophenyl)-2-morpholino-propan-1-one (6) | bis-(3-ethyl-5-methyl-4-maleimide-phenyl)methane (5) | DAA (225) PGMEA (97) | DFX-18 30 ppm |
| Ex. 9 | 9 | PS-01 (90) | 15 mol % | — | N-acryloyloxy-ethyl hexahydro-phtalimide (10) | 2-methyl-1-(4-methylthiophenyl)-2-morpholino-propan-1-one (6) | bis-(3-ethyl-5-methyl-4-maleimide-phenyl)methane (5) | DAA (225) PGMEA (97) | DFX-18 30 ppm |

TABLE 2

| | | (a) Metal compound particles + (b) Polysiloxane compound | | (c) Compound having at least 1 group containing an α,β-unsaturated carboxylate ester | | | (e) Maleimide | | |
|---|---|---|---|---|---|---|---|---|---|
| | Composition No. | Type (parts by weight) | Ratio of carboxyl group in the polysiloxane compound and/or organosilane containing dicarboxylic anhydride | Compound not corresponding to general formulae (5) to (10) Type (parts by weight) | Compound corresponding to general formulae (5) to (10) Type (parts by weight) | (d) Photopolymerization initiator Type (parts by weight) | group-containing compound Type (parts by weight) | (f) Solvent Type (parts by weight) | Other additives Type content |
| Ex. 10 | 10 | PS-02 (90) | 50 mol % | trimethylol propane EO-modified | adamantane diacrylate (8) | 1,2-octanedione, 1-[4-(phenylthio)-2-(o-benzoyloxime)] | bis-(3-ethyl-5-methyl-4- | DAA (225) PGMEA | DFX-18 30 ppm |

TABLE 2-continued

| | | (a) Metal compound particles + (b) Polysiloxane compound | | (c) Compound having at least 1 group containing an α,β-unsaturated carboxylate ester | | | (e) Maleimide | | |
|---|---|---|---|---|---|---|---|---|---|
| | Composition No. | Type (parts by weight) | Ratio of carboxyl group in the polysiloxane compound and/or organosilane containing dicarboxylic anhydride | Compound not corresponding to general formulae (5) to (10) Type (parts by weight) | Compound corresponding to general formulae (5) to (10) Type (parts by weight) | (d) Photopolymerization initiator Type (parts by weight) | group-containing compound Type (parts by weight) | (f) Solvent Type (parts by weight) | Other additives Type content |
| Ex. 11 | 11 | PS-03 (90) | 50 mol % | trimethylol propane EO-modified triacrylate (2) | adamantane diacrylate (8) | methyl o-benzoylbenzoate (7) | maleimidephenyl methane (3) bis-(3-ethyl-5-methyl-4-maleimidephenyl) methane (3) | DAA (225) PGMEA (97) | DFX-18 30 ppm |
| Ex. 12 | 12 | PS-04 (90) | 25 mol % | trimethylol propane EO-modified triacrylate (2) | adamantane diacrylate (8) | 1,2-octanedione, 1-[4-(phenylthio)-2-(o-benzoyloxime)] (6) | bis-(3-ethyl-5-methyl-4-maleimidephenyl) methane (5) | DAA (225) PGMEA (97) | DFX-18 30 ppm |
| Ex. 13 | 13 | PS-05 (90) | 25 mol % | trimethylol propane EO-modified triacrylate (2) | adamantane diacrylate (8) | bis(2,4,6-trimethylbenzoyl)-phenylphosphine oxide (8) | bis-(3-ethyl-5-methyl-4-maleimidephenyl) methane (5) | DAA (225) PGMEA (97) | DFX-18 30 ppm |
| Ex. 14 | 14 | PS-06 (90) | 25 mol % | trimethylol propane EO-modified triacrylate (2) | adamantane diacrylate (8) | bis(2,4,6-trimethylbenzoyl)-phenylphosphine oxide (8) | bis-(3-ethyl-5-methyl-4-maleimidephenyl) methane (5) | DAA (225) PGMEA (97) | DFX-18 30 ppm |

TABLE 3

| | | (a) Metal compound particles + (b) Polysiloxane compound | | (c) Compound having at least 1 group containing an α,β-unsaturated carboxylate ester | | | (e) Maleimide | | |
|---|---|---|---|---|---|---|---|---|---|
| | Composition No. | Type (parts by weight) | Ratio of carboxyl group in the polysiloxane compound and/or organosilane containing dicarboxylic anhydride | Compound not corresponding to general formulae (5) to (10) Type (parts by weight) | Compound corresponding to general formulae (5) to (10) Type (parts by weight) | (d) Photopolymerization initiator Type (parts by weight) | group-containing compound Type (parts by weight) | (f) Solvent Type (parts by weight) | Other additives Type content |
| Comp. Ex. 1 | 15 | PS-01 (90) | 15 mol % | ethoxylated o-pheylphenol acrylate (10) | — | 2-methyl-1-(4-methylthiophenyl)-2-morpholinopropan-1-one (6) | — | DAA (225) PGMEA (97) | DFX-18 30 ppm |
| Comp. Ex. 2 | 16 | PS-01 (80) | 15 mol % | 2-acryloyloxyethyl succinate (20) | — | 2-methyl-1-(4-methylthiophenyl)-2-morpholinopropan-1-one (6) | — | DAA (225) PGMEA (97) | DFX-18 30 ppm |
| Comp. Ex. 3 | 17 | PS-01 (85) | 15 mol % | — | dimethylol tricyclodecane diacrylate (15) | 2-methyl-1-(4-methylthiophenyl)-2-morpholinopropan-1-one (6) | — | DAA (225) PGMEA (97) | DFX-18 30 ppm |
| Comp. Ex. 4 | 18 | PS-01 (90) | 15 mol % | — | 1-naphthyl acrylate (10) | 2-methyl-1-(4-methylthiophenyl)-2-morpholinopropan-1-one (6) | — | DAA (225) PGMEA (97) | DFX-18 30 ppm |

TABLE 3-continued

| Composition No. | (a) Metal compound particles + (b) Polysiloxane compound Type (parts by weight) | Ratio of carboxyl group in the polysiloxane compound and/or organosilane containing dicarboxylic anhydride | (c) Compound having at least 1 group containing an α,β-unsaturated carboxylate ester | | (d) Photopolymerization initiator Type (parts by weight) | (e) Maleimide group-containing compound Type (parts by weight) | (f) Solvent Type (parts by weight) | Other additives Type content |
|---|---|---|---|---|---|---|---|---|
| | | | Compound not corresponding to general formulae (5) to (10) Type (parts by weight) | Compound corresponding to general formulae (5) to (10) Type (parts by weight) | | | | |
| Comp. Ex. 5 | 19 PS-01 (90) | 15 mol % | — | 1-naphthyl acrylate (2.5), 1,4-ethylene oxide diacrylate naphthalene (7.5) | 2-methyl-1-(4-methylthiophenyl)-2-morpholinopropan-1-one (6) | — | DAA (225) PGMEA (97) | DFX-18 30 ppm |

TABLE 4

| Composition No. | (a) Metal compound particles + (b) Polysiloxane compound Type (parts by weight) | Ratio of carboxyl group in the polysiloxane compound and/or organosilane containing dicarboxylic anhydride | (c) Compound having at least 1 group containing an α,β-unsaturated carboxylate ester | | (d) Photopolymerization initiator Type (parts by weight) | (e) Maleimide group-containing compound Type (parts by weight) | (f) Solvent Type (parts by weight) | Other additives Type content |
|---|---|---|---|---|---|---|---|---|
| | | | Compound not corresponding to general formulae (5) to (10) Type (parts by weight) | Compound corresponding to general formulae (5) to (10) Type (parts by weight) | | | | |
| Comp. Ex. 6 | 20 PS-01 (90) | 15 mol % | — | 1-naphthyl acrylate (7.5), 1,4-ethylene oxide diacrylate naphthalene (2.5) | 2-methyl-1-(4-methylthiophenyl)-2-morpholinopropan-1-one (6) | — | DAA (225) PGMEA (97) | DFX-18 30 ppm |
| Comp. Ex. 7 | 21 PS-01 (90) | 15 mol % | dipentaerythritol hexaacrylate (10) | 9,9-bis[4-(2-acryloyloxyethoxy)phenyl]fluorine (10) | 2-methyl-1-(4-methylthiophenyl)-2-morpholinopropan-1-one (6) | — | DAA (225) PGMEA (97) | DFX-18 30 ppm |
| Comp. Ex. 8 | 22 PS-01 (90) | 15 mol % | — | norbornene ethylene diacrylate (10) | 2-methyl-1-(4-methylthiophenyl)-2-morpholinopropan-1-one (6) | — | DAA (225) PGMEA (97) | DFX-18 30 ppm |
| Comp. Ex. 9 | 23 PS-01 (90) | 15 mol % | trimethylolpropane EO-modified triacrylate (2) | adamantane diacrylate (8) | 2-methyl-1-(4-methylthiophenyl)-2-morpholinopropan-1-one (6) | — | DAA (225) PGMEA (97) | DFX-18 30 ppm |
| Comp. Ex. 10 | 24 PS-01 (90) | 15 mol % | — | N-acryloyloxy ethyl hexahydro phtalimlde (10) | 2-methyl-1-(4-methylthiophenyl)-2-morpholinopropan-1-one (6) | — | DAA (225) PGMEA (97) | DFX-18 30 ppm |

TABLE 5

| Composition No. | (a) Metal compound particles + (b) Polysiloxane compound Type (parts by weight) | Ratio of carboxyl group in the polysiloxane compound and/or organosilane containing dicarboxylic anhydride | (c) Compound having at least 1 group containing an α,β-unsaturated carboxylate ester | | (d) Photopolymerization initiator Type (parts by weight) | (e) Maleimide group-containing compound Type (parts by weight) | (f) Solvent Type (parts by weight) | Other additives Type content |
|---|---|---|---|---|---|---|---|---|
| | | | Compound not corresponding to general formulae (5) to (10) Type (parts by weight) | Compound corresponding to general formulae (5) to (10) Type (parts by weight) | | | | |
| Comp. Ex. 11 | 25 PS-02 (90) | 50 mol % | trimethylolpropane EO-modified triacrylate (2) | adamantane diacrylate (8) | 1,2-octanedione, 1-[4-(phenylthio)-2-(o-benzoyloxime)] (6) | — | DAA (225) PGMEA (97) | DFX-18 30 ppm |
| Comp. Ex. 12 | 26 PS-03 (90) | 50 mol % | trimethylolpropane EO-modified triacrylate (2) | adamantane diacrylate (8) | methyl o-benzoylbenzoate (12) | — | DAA (225) PGMEA (97) | DFX-18 30 ppm |
| Comp. Ex. 13 | 27 PS-04 (90) | 25 mol % | trimethylolpropane EO-modified triacrylate (2) | adamantane diacrylate (8) | 1,2-octanedione, 1-[4-(phenylthio)-2-(o-benzoyloxime)] (6) | — | DAA (225) PGMEA (97) | DFX-18 30 ppm |
| Comp. Ex. 14 | 28 PS-05 (90) | 25 mol % | trimethylolpropane EO-modified triacrylate (2) | adamantane diacrylate (8) | bis(2,4,6-trimethyl-benzoyl)-phenylphosphine oxide (8) | — | DAA (225) PGMEA (97) | DFX-18 30 ppm |
| Comp. Ex. 15 | 29 PS-06 (90) | 25 mol % | trimethylolpropane EO-modified triacrylate (2) | adamantane diacrylate (8) | bis(2,4,6-trimethyl-benzoyl)-phenylphosphine oxide (8) | — | DAA (225) PGMEA (97) | DFX-18 30 ppm |

TABLE 6

| Composition No. | (a) Metal compound particles + (b) Polysiloxane compound Type (parts by weight) | Ratio of carboxyl group in the polysiloxane compound and/or organosilane containing dicarboxylic anhydride | (c) Compound having at least 1 group containing an α,β-unsaturated carboxylate ester | | (d) Photopolymerization initiator Type (parts by weight) | (e) Maleimide group-containing compound Type (parts by weight) | (f) Solvent Type (parts by weight) | Other additives Type content |
|---|---|---|---|---|---|---|---|---|
| | | | Compound not corresponding to general formulae (5) to (10) Type (parts by weight) | Compound corresponding to general formulae (5) to (10) Type (parts by weight) | | | | |
| Comp. Ex. 16 | 30 PS-01 (94) | 15 mol % | dipentaerythritol hexaacrylate (6) | — | 2-methyl-1-(4-methylthiophenyl)-2-morpholinopropan-1-one (6) | — | DAA (225) PGMEA (97) | DFX-18 30 ppm |
| Comp. Ex. 17 | 31 PS-01 (90) | 15 mol % | ε-caprolactone-modified tris-(2-acryloxy-ethyl)isocyanurate (10) | — | 2-methyl-1-(4-methylthiophenyl)-2-morpholinopropan-1-one (6) | — | DAA (225) PGMEA (97) | DFX-18 30 ppm |
| Comp. Ex. 18 | 32 PS-01 (90) | 15 mol % | trimethylolpropane EO-modified triacrylate (2) | adamantane diacrylate (8) | — | — | DAA (225) PGMEA (97) | DFX-18 30 ppm |
| Comp. Ex. 19 | 33 PS-07 (90) | 20 mol % | trimethylolpropane EO-modified triacrylate (2) | adamantane diacrylate (8) | 2-methyl-1-(4-methylthiophenyl)-2-morpholinopropan-1-one (6) | — | DAA (225) PGMEA (97) | DFX-18 30 ppm |
| Comp. Ex. 20 | 34 PS-08 (90) | 20 mol % | trimethylolpropane EO-modified triacrylate (2) | adamantane diacrylate (8) | 2-methyl-1-(4-methylthiophenyl)-2-morpholinopropan-1-one (6) | — | DAA (225) PGMEA (97) | DFX-18 30 ppm |

TABLE 6-continued

| | (a) Metal compound particles + (b) Polysiloxane compound | | (c) Compound having at least 1 group containing an α,β-unsaturated carboxylate ester | | | (e) Maleimide group-containing compound | (f) Solvent | |
|---|---|---|---|---|---|---|---|---|
| Composition No. | Type (parts by weight) | Ratio of carboxyl group in the polysiloxane compound and/or organosilane containing dicarboxylic anhydride | Compound not corresponding to general formulae (5) to (10) Type (parts by weight) | Compound corresponding to general formulae (5) to (10) Type (parts by weight) | (d) Photopolymerization initiator Type (parts by weight) | Type (parts by weight) | Type (parts by weight) | Other additives Type content |
| Comp. Ex. 21 | 35 | PS-09 (90) | 50 mol % | trimethylolpropane EO-modified triacrylate (2) | adamantane diacrylate (8) | 2-methyl-1-(4-methylthiophenyl)-2-morpholinopropan-1-one (6) | — | DAA (225) PGMEA (97) | DFX-18 30 ppm |

TABLE 7

| | (1) Film thickness | | (2) Residual film rate (%) | (3) Exposure sensitivity (J/m²) | (4) Resolution | | (5) Refractive index (550 nm) | (6) Light transmittance [per 1 μm at a wavelength of 400 nm] (%) | (7) Solvent resistance | (8) Taper angle |
|---|---|---|---|---|---|---|---|---|---|---|
| Composition No. | After pre-baking (μm) | After curing (μm) | | | After development (μm) | After curing (μm) | | | | |
| Ex. 1 | 1 | 1.0 | 0.92 | 92 | 750 | 1 | 1 | 1.77 | 96 | B | B |
| Ex. 2 | 2 | 1.0 | 0.93 | 95 | 700 | 1 | 1 | 1.77 | 96 | A | A |
| Ex. 3 | 3 | 1.0 | 0.94 | 98 | 650 | 1 | 1 | 1.78 | 96 | A | A |
| Ex. 4 | 4 | 1.0 | 0.93 | 94 | 800 | 1 | 1 | 1.77 | 96 | A | B |
| Ex. 5 | 5 | 1.0 | 0.92 | 94 | 750 | 1 | 1 | 1.75 | 96 | B | A |
| Ex. 6 | 6 | 1.0 | 0.91 | 92 | 750 | 1 | 1 | 1.77 | 96 | A | B |
| Ex. 7 | 7 | 1.0 | 0.92 | 95 | 550 | 1 | 1 | 1.78 | 95 | A | A |
| Ex. 8 | 8 | 1.0 | 0.95 | 97 | 600 | 1 | 1 | 1.78 | 96 | A | A |
| Ex. 9 | 9 | 1.0 | 0.95 | 98 | 750 | 1 | 1 | 1.78 | 96 | A | A |
| Ex. 10 | 10 | 1.0 | 0.90 | 93 | 700 | 1 | 1 | 1.77 | 95 | B | A |
| Ex. 11 | 11 | 1.0 | 0.92 | 95 | 750 | 1 | 1 | 1.77 | 95 | B | A |
| Ex. 12 | 12 | 1.0 | 0.95 | 97 | 700 | 1 | 1 | 1.77 | 96 | A | A |
| Ex. 13 | 13 | 1.0 | 0.97 | 99 | 600 | 1 | 1 | 1.77 | 95 | A | A |
| Ex. 14 | 14 | 1.0 | 0.95 | 97 | 500 | 1 | 1 | 1.76 | 96 | A | A |

TABLE 8

| | (1) Film thickness | | (2) Residual film rate (%) | (3) Exposure sensitivity (J/m²) | (4) Resolution | | (5) Refractive index (550 nm) | (6) Light transmittance [per 1 μm at a wavelength of 400 nm] (%) | (7) Solvent resistance | (8) Taper angle |
|---|---|---|---|---|---|---|---|---|---|---|
| Composition No. | After pre-baking (μm) | After curing (μm) | | | After development (μm) | After curing (μm) | | | | |
| Comp. Ex. 1 | 15 | 1.0 | 0.90 | 92 | 750 | 7 | 7 | 1.77 | 96 | B | D |
| Comp. Ex. 2 | 16 | 1.0 | 0.92 | 95 | 800 | 7 | 7 | 1.76 | 96 | B | D |
| Comp. Ex. 3 | 17 | 1.0 | 0.89 | 92 | 900 | 1 | 1 | 1.76 | 96 | A | C |
| Comp. Ex. 4 | 18 | 1.0 | 0.90 | 92 | 850 | 1 | 1 | 1.78 | 96 | B | C |
| Comp. Ex. 5 | 19 | 1.0 | 0.91 | 93 | 800 | 3 | 3 | 1.77 | 96 | A | D |
| Comp. Ex. 6 | 20 | 1.0 | 0.90 | 92 | 850 | 1 | 1 | 1.75 | 96 | B | C |
| Comp. Ex. 7 | 21 | 1.0 | 0.90 | 92 | 750 | 2 | 1 | 1.77 | 96 | A | C |
| Comp. Ex. 8 | 22 | 1.0 | 0.85 | 90 | 700 | 1 | 1 | 1.77 | 95 | A | C |
| Comp. Ex. 9 | 23 | 1.0 | 0.88 | 90 | 750 | 1 | 1 | 1.77 | 96 | A | C |
| Comp. Ex. 10 | 24 | 1.0 | 0.92 | 94 | 800 | 1 | 1 | 1.77 | 96 | A | C |
| Comp. Ex. 11 | 25 | 1.0 | 0.90 | 92 | 750 | 5 | 1 | 1.77 | 95 | B | C |
| Comp. Ex. 12 | 26 | 1.0 | 0.90 | 95 | 750 | 5 | 1 | 1.77 | 95 | B | C |
| Comp. Ex. 13 | 27 | 1.0 | 0.89 | 90 | 800 | 1 | 1 | 1.77 | 96 | A | C |
| Comp. Ex. 14 | 28 | 1.0 | 0.92 | 95 | 700 | 1 | 1 | 1.77 | 95 | A | C |
| Comp. Ex. 15 | 29 | 1.0 | 0.89 | 92 | 650 | 1 | 1 | 1.76 | 96 | A | C |

TABLE 9

|  | (1) Film thickness | | (2) Residual film rate (%) | (3) Exposure sensitivity (J/m²) | (4) Resolution | | (5) Refractive index (550 nm) | (6) Light transmittance [per 1 μm at a wavelength of 400 nm] (%) | (7) Solvent resistance | (8) Taper angle |
|---|---|---|---|---|---|---|---|---|---|---|
| Composition No. | After pre-baking (μm) | After curing (μm) | | | After development (μm) | After curing (μm) | | | | |
| Comp. Ex. 16 | 30 | 1.0 | 0.93 | 95 | 700 | 100 | 100 | 1.77 | 96 | A | D |
| Comp. Ex. 17 | 31 | 1.0 | 0.89 | 92 | 700 | 70 | 70 | 1.79 | 96 | A | D |
| Comp. Ex. 18 | 32 | 1.0 | †1 | 0 | †1 | †1 | †1 | 1.77 †2 | 100 †2 | D †2 | D |
| Comp. Ex. 19 | 33 | 1.0 | †1 | 0 | †1 | †1 | †1 | 1.65 †2 | 98 †2 | D †2 | D |
| Comp. Ex. 20 | 34 | 1.0 | †1 | 0 | †1 | †1 | †1 | 1.75 †2 | 98 †2 | D †2 | D |
| Comp. Ex. 21 | 35 | 1.0 | 0.83 | 85 | 800 | 1 | 1 | 1.65 | 96 | D | C |

†1: Evaluation was not conducted due to total dissolution of the film in the development.
†2: Evaluation was conducted without development.

The invention claimed is:

1. A negative photosensitive resin composition comprising the following (a) to (d):
   (a) metallic compound particles,
   (b) a polysiloxane compound,
   (c) a compound having at least 1 group containing an α,β-unsaturated carboxylate ester structure, and
   (d) a photopolymerization initiator, the composition further comprising
   (e) a compound containing maleimide group.

2. A negative photosensitive resin composition according to claim 1 wherein the polysiloxane compound (b) is a polysiloxane compound containing the structural unit represented by general formula (1) and/or (2):

[Chemical formula 1]

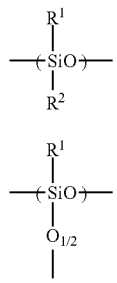

(1)

(2)

wherein $R^1$ is an organic group containing carboxyl group and/or a dicarboxylic anhydride structure, $R^2$ is hydrogen, an alkyl group containing 1 to 6 carbon atoms, an acyl group containing 2 to 6 carbon atoms, or an aryl group containing 6 to 16 carbon atoms.

3. A negative photosensitive resin composition according to claim 2 wherein the polysiloxane compound (b) further contains a structural unit represented by general formula (3) and/or (4):

[Chemical formula 2]

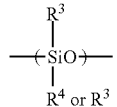

(3)

(4)

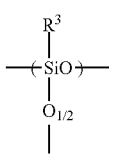

wherein $R^3$ is an organic group containing an alkenyl group containing 2 to 10 carbon atoms, $R^4$ is hydrogen, an alkyl group containing 1 to 6 carbon atoms, an acyl group containing 2 to 6 carbon atoms, an organic group containing an alkenyl group containing 2 to 10 carbon atoms, or an aryl group containing 6 to 16 carbon atoms.

4. A negative photosensitive resin composition according to claim 3 wherein $R^3$ is an allyl group, a vinyl group, (meth)acryloyl group, or styryl group.

5. A negative photosensitive resin composition according to claim 1 wherein the compound (c) having at least 1 group containing an α,β-unsaturated carboxylate ester structure is a compound selected from general formulae (5) to (10):

[Chemical formula 6]

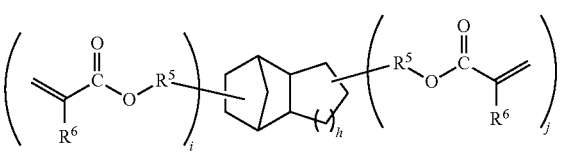

(5)

wherein in general formula (5), $R^5$ is single bond, a chain aliphatic group containing 1 to 10 carbon atoms and 1 to 3 oxygen atoms, or a cyclic aliphatic hydrocarbon group containing 3 to 16 carbon atoms; the plurality of $R^3$ being independently the same or different; $R^6$ is hydrogen or methyl group, the plurality of $R^6$ being independently the same or different; h is an integer of 0 to 3; i and j are integer of 0 to 2, i+j being 1 to 2,

[Chemical formula 4]

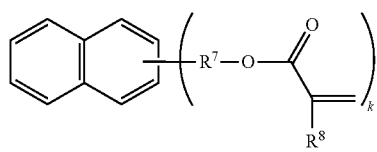

(6)

wherein in general formula (6), $R^7$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^7$ being independently the same or different, $R^8$ is hydrogen or methyl group, the plurality of $R^8$ being independently the same or different; and k is an integer of 1 to 2,

[Chemical formula 5]

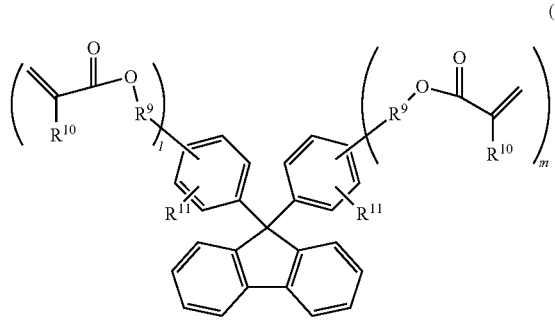

(7)

wherein in general formula (7), $R^9$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^9$ being independently the same or different; $R^{10}$ is hydrogen or methyl group, the plurality $R^{10}$ being independently the same or different; $R^{11}$ is hydrogen or a chain aliphatic group containing 1 to 10 carbon atoms and 1 to 3 oxygen atoms, or a cyclic aliphatic hydrocarbon group containing 3 to 16 carbon atoms, the plurality of $R^{11}$ being independently the same or different; and l and m are an integer of 0 to 2, l+m being 1 to 2,

[Chemical formula 6]

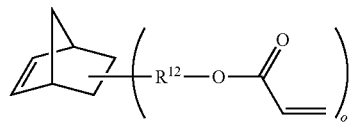

(8)

wherein in general formula (8), $R^{12}$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^{11}$ being independently the same or different; and o is an integer of 1 to 2,

[Chemical formula 7]

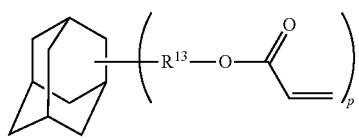

(9)

wherein in general formula (9), $R^{13}$ is single bond, a chain aliphatic group containing 1 to 10 carbon atoms and 1 to 3 oxygen atoms, or a cyclic aliphatic hydrocarbon group containing 3 to 16 carbon atoms, the plurality of $R^{12}$ being independently the same or different; and p is an integer of 1 to 2,

[Chemical formula 8]

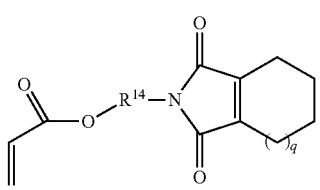

(10)

wherein in general formula (10), q is an integer of 0 to 3 and $R^{14}$ is a chain aliphatic group containing 1 to 10 carbon atoms and 1 to 3 oxygen atoms.

6. A negative photosensitive resin composition according to claim 1 wherein $R^1$ of the polysiloxane compound (b) is an organic group having a dicarboxylic anhydride represented by any one of general formula (11) to (13):

[Chemical formula 9]

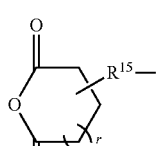

(11)

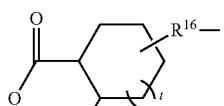

(12)

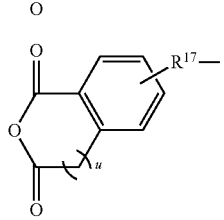

(13)

wherein in the general formula (11) to (13), $R^{15}$, $R^{16}$, and $R^{17}$ are single bond, a chain aliphatic hydrocarbon group containing 1 to 10 carbon atoms, a cyclic aliphatic hydrocarbon group containing 3 to 16 carbon atoms, an alkyl carbonyloxy group containing 2 to 6 carbon atoms, carbonyl group, ether group, ester group, amide group, an aromatic group containing 6 to 16 carbon atoms, or a divalent group having any one of these groups; the hydrogen atom of these groups being optionally substituted with an alkyl group containing 1 to 10 carbon atoms, an alkenyl group containing 2 to 10 carbon atoms, an aryl group containing 6 to 16 carbon atoms, an alkylcarbonyloxy group containing 2 to 6 carbon atoms, hydroxy group, amino group, carboxyl group, or thiol group; and r, s, t, and u represent an integer of 0 to 3.

7. A negative photosensitive resin composition according to claim 1 wherein ratio of molar amount of the Si atoms in the structural unit represented by the general formula (1) and/or (2) constituting the polysiloxane compound to molar amount of the Si atom of the polysiloxane compound (b) is at least 5 mol % to up to 30 mol %.

8. A negative photosensitive resin composition according to claim 1 wherein the metallic compound particles (a) is at least one metal compound particles selected from aluminum compound particles, tin compound particles, titanium compound particles, and zirconium compound particles; or a composite particles of at least one metallic compound selected from aluminum compound, tin compound, titanium compound, and zirconium compound with a silicon compound.

9. A negative photosensitive resin composition according to claim 1 wherein the metallic compound particles (a) and the polysiloxane compound (b) are partially bonded.

10. A negative photosensitive resin composition according to claim 1 wherein the metallic compound particles (a) have a number average particle diameter of 1 nm to 400 nm.

11. A negative photosensitive resin composition according to claim 1 wherein at least 10 parts by weight to up to 500 parts by weight of the metallic compound particles (a) is used in relation to 100 parts by weight of the polysiloxane compound (b).

12. A cured film prepared by curing the negative photosensitive resin composition of claim 1.

13. An LED luminaire having the cured film of claim 12.

14. An image sensor having the cured film of claim 12.

15. A method for producing a cured film comprising the steps of coating the negative photosensitive resin composition of claim 1 on a substrate, developing the coating after exposure, and curing the coating by heat.

16. A backside illuminated CMOS image sensor comprising at least a photoelectric conversion layer, a color filter, and a flattening layer in this order, wherein the color filter has colored pixels divided by the pattern obtained by using the negative photosensitive resin composition of claim 1, and wherein refractive index of the flattening layer is smaller than the refractive index the pattern.

* * * * *